United States Patent
Honda

(10) Patent No.: US 7,315,475 B2
(45) Date of Patent: Jan. 1, 2008

(54) NON-VOLATILE SEMICONDUCTOR MEMORY DEVICE

(75) Inventor: Yasuhiko Honda, Hiratsuka (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 11/496,458

(22) Filed: Aug. 1, 2006

(65) Prior Publication Data

US 2007/0030731 A1 Feb. 8, 2007

(30) Foreign Application Priority Data

Aug. 2, 2005 (JP) ............................. 2005-224311

(51) Int. Cl.
*G11C 11/34* (2006.01)
(52) U.S. Cl. .................... 365/185.2; 365/185.23; 365/185.24; 365/185.29; 365/185.22
(58) Field of Classification Search .......... 365/185.2, 365/185.22, 185.23, 185.24, 185.29
See application file for complete search history.

(56) References Cited

U.S. PATENT DOCUMENTS

| | | | | |
|---|---|---|---|---|
| 6,504,778 | B1* | 1/2003 | Uekubo | 365/185.2 |
| 6,807,097 | B2* | 10/2004 | Takano et al. | 365/185.21 |
| 6,829,171 | B2* | 12/2004 | Ooishi | 365/185.2 |
| 7,139,201 | B2* | 11/2006 | Tanaka et al. | 365/185.29 |

* cited by examiner

*Primary Examiner*—Trong Phan
(74) *Attorney, Agent, or Firm*—Oblon, Spivak, McClelland, Maier & Neustadt, P.C.

(57) ABSTRACT

A sense amplifier has first and second input nodes. A reference memory cell is connected to the first input node. To the second input node, a constant current source circuit and a main memory cell are connected via a first transistor and a second transistor, respectively. A current mirror type load circuit is provided as a load circuit of the reference memory cell and the main memory cell. When a threshold voltage of the reference memory cell is adjusted, the first transistor is turned on and the second transistor is turned off. When the threshold voltage of the memory cell is adjusted at verification of writing to/erasing from the memory cell, the first transistor is turned off and the second transistor is turned on.

20 Claims, 16 Drawing Sheets

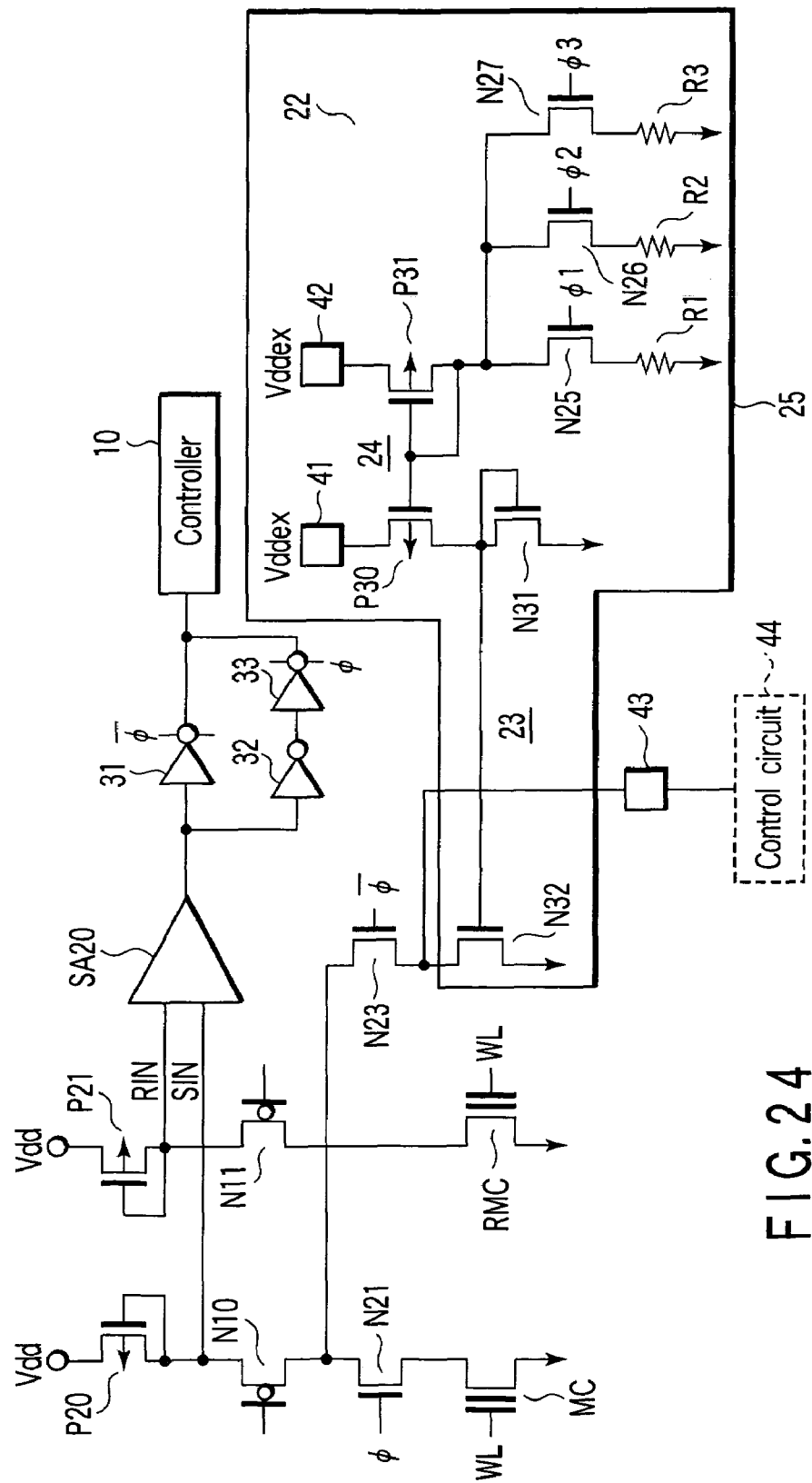
F I G. 24

NON-VOLATILE SEMICONDUCTOR MEMORY DEVICE

CROSS-REFERENCE TO RELATED APPLICATIONS

This application is based upon and claims the benefit of priority from prior Japanese Patent Application No. 2005-224311, filed Aug. 2, 2005, the entire contents of which are incorporated herein by reference.

BACKGROUND OF THE INVENTION

1. Field of the Invention

The present invention relates to a non-volatile semiconductor memory device that compares currents flowing in a reference memory cell and a main memory cell by a sense amplifier to thereby perform data sensing, and more specifically, to a non-volatile semiconductor memory device in which threshold voltages of a reference memory cell and a main memory cell are adjusted.

2. Description of the Related Art

Various kinds of electrically batch-erasable non-volatile semiconductor memory devices having, for example, an EEPROM cell (hereinafter referred to as flash memories) have been developed. In Jpn. Pat. Appln. KOKAI Publication No. 2004-103211, or B. Pathank et al., A 1.8V 64 Mb 100 MHz Flexible Read While Write Flash Memory, 2001, IEEE International Solid-State Circuits Conference, a NOR type flash memory of a current comparison type sensing system is disclosed. Read and verify operations in the flash memory of this system are performed by comparing currents flowing in a selected memory cell and a reference memory cell by means of a sense amplifier.

In the current comparison type sensing system, there are known two kinds, that is, an Iref direct system in which a reference current Iref is directly supplied to an input terminal of a sense amplifier, and an Iref mirror system in which a reference current Iref is supplied to an input terminal of a sense amplifier via a current mirror circuit.

In a memory of the Iref direct system, plural reference memory cells are used. Threshold voltages of the respective reference memory cells are not uniform, but uneven. When the threshold voltages of the reference memory cells fluctuate, a threshold voltage of a main memory cell also fluctuates.

BRIEF SUMMARY OF THE INVENTION

According to one aspect of the present invention, there is provided a non-volatile semiconductor memory device comprising: a main memory cell which is included a non-volatile transistor and whose threshold voltage is adjustable; a reference memory cell which is included a non-volatile transistor and whose threshold voltage is adjustable; a sense amplifier which has a first input node, a second input nodes and an output node, the reference memory cell being coupled to the first input node; a current mirror type load circuit connected to the first input node and the second input node of the sense amplifier; a first transistor which has one end and the other end, the one end being coupled to the second input node of the sense amplifier; a reference current source circuit connected to the other end of the first transistor; a second transistor which has one end and the other end, the one end being coupled to the second input node of the sense amplifier, and the main memory cell being connected to the other end; and a controller which generates a control signal to control the first transistor being turned on and the second transistor being turned off when the threshold voltage of the reference memory cell is adjusted, and to control the first transistor being turned off and the second transistor being turned on when the threshold voltage of the main memory cell is adjusted at verification of writing to/erasing from the main memory cell.

BRIEF DESCRIPTION OF THE SEVERAL VIEWS OF THE DRAWING

FIG. 24 is a circuit diagram of a flash memory according to a modified example of the seventh embodiment.

DETAILED DESCRIPTION OF THE INVENTION

Now, embodiments of the present invention will be described in more details with reference to the accompanying drawings.

Figure 1:
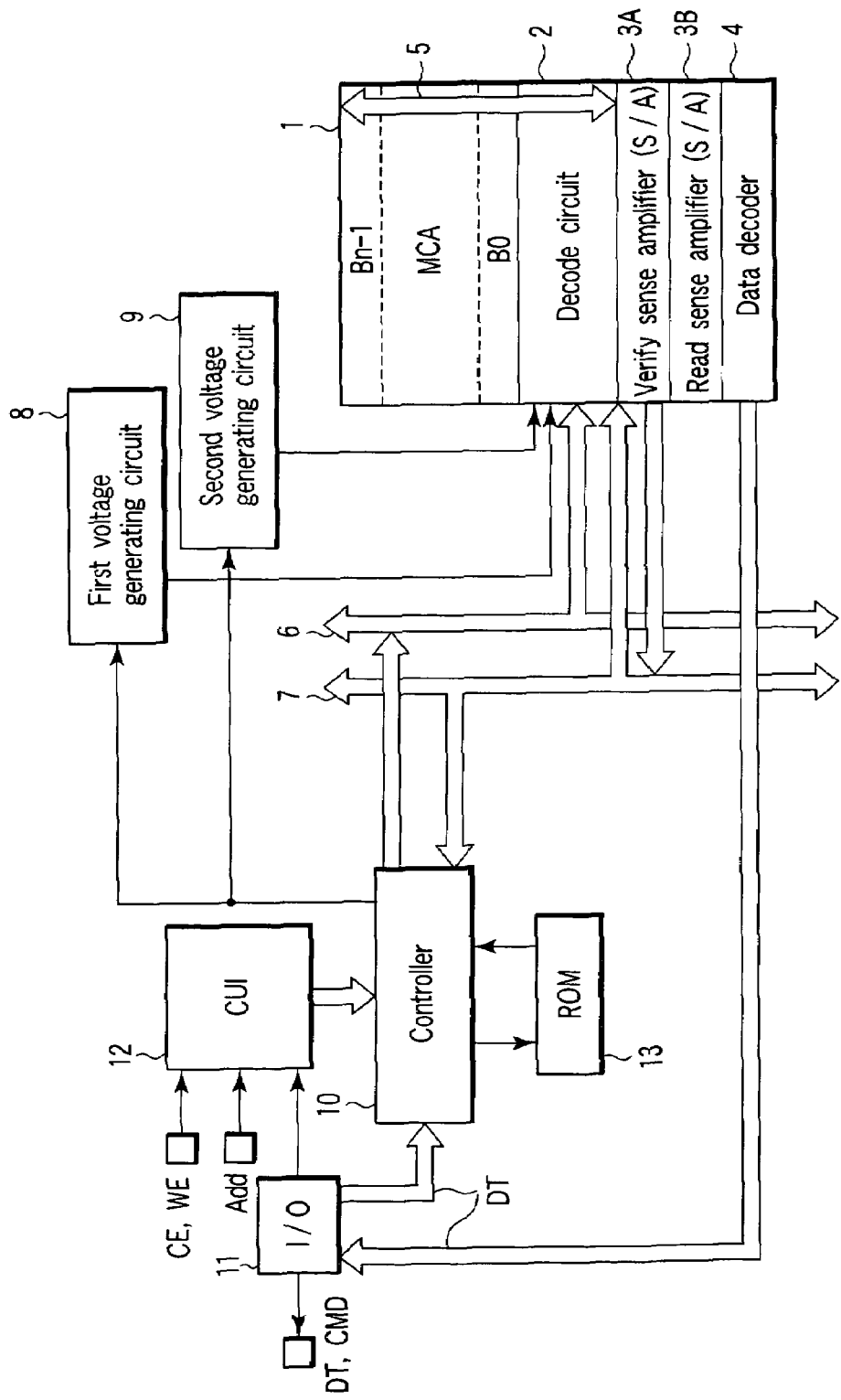
FIG. 1 is a block diagram of a flash memory that stores multiple-valued data.

First, the configuration of a flash memory that stores multiple-valued data will be described with reference to FIGS. 1, 2 and 3. As shown in FIG. 1, a memory cell array (MCA) 1 has n blocks B0 to Bn−1. Each of the blocks B0 to Bn−1 is the minimum unit of data erasing. The memory cell array 1 further includes a decode circuit 2 that selects a memory cell, a verify sense amplifier (S/A) 3A, a read sense amplifier (S/A) 3B, and a data decoder 4. Further, a data bus 5 is arranged in common to the respective blocks B0 to Bn−1 of the memory cell array 1.

The decode circuit 2 is connected to an address bus 6, and selects a word line (row line) and a bit line (column line) according to an address signal supplied from a controller 10 to thereby select a memory cell.

Input terminals of the verify sense amplifier 3A and the read sense amplifier 3B are connected respectively to the data bus 5. In the case when, for example 4-value, 2-bit data is stored to each memory cell, the verify sense amplifier 3A and the read sense amplifier 3B have a reference current generation circuit using at least one reference memory cell, in order to generate 3-value reference currents respectively. These sense amplifiers 3A and 3B compare a reference current supplied from the reference current generation circuit, and a current flowing in the selected memory cell to sense data.

An output terminal of the verify sense amplifier 3A is connected to a data bus 7. The verify sense amplifier 3A detects a signal read from the memory cell at the time of data writing or erasing, and supplies the detected signal to the controller 10. An output terminal of the read sense amplifier 3B is connected to the data decoder 4. The data decoder 4 decodes a signal supplied from the read sense amplifier 3B, and thereby generates an output signal. An output terminal of the data decoder 4 is connected to an input/output circuit (I/O) 11. At the time of data reading, a signal DT output from the data decoder 4 is output to the outside via the input/output circuit 11.

The address bus 6 and the data bus 7, each of which is composed of a plurality of signal lines, are connected to the controller 10. The input/output circuit 11, a command user interface (CUI) 12, a ROM 13, and first and second voltage generating circuits 8, 9 are connected to the controller 10. The input/output circuit 11 supplies a command CMD supplied from the outside to the CUI 12, and supplies write data DT of the memory cell to the controller 10. Further, the input/output circuit 11 outputs read data DT supplied from the read sense amplifier 3B to the outside.

The CUI 12 receives control signals including a chip enable signal CE and a write enable signal WE and an address signal Add which are input from the outside, and processes the signals to supply them to the controller 10. In the ROM 13, various programs for controlling the operations of the controller 10 are stored. The controller 10 controls the operations of the entire flash memory according to a command CMD and programs. More specifically, the controller 10 supplies the address signal to the address bus 6, and supplies the write data to the data bus 7. Further, the controller 10 controls the first and second voltage generating circuits 8, 9 to generate predetermined voltages at the time of data writing, verifying, data reading and erasing. The first voltage generating circuit 8 generates a voltage to be supplied to a control gate of the memory cell, i.e., a word line voltage at the time of data writing, verifying, and data reading. The word line voltage is supplied to the word line via a row main decoder and a row predecoder in the decode circuit 2. In addition, the second voltage generating circuit 9 generates a drain voltage to be supplied to a drain of the memory cell at the time of data writing. The drain voltage is supplied to the drain of the memory cell via a column predecoder and a column gate in the decode circuit 2.

Figure 2:
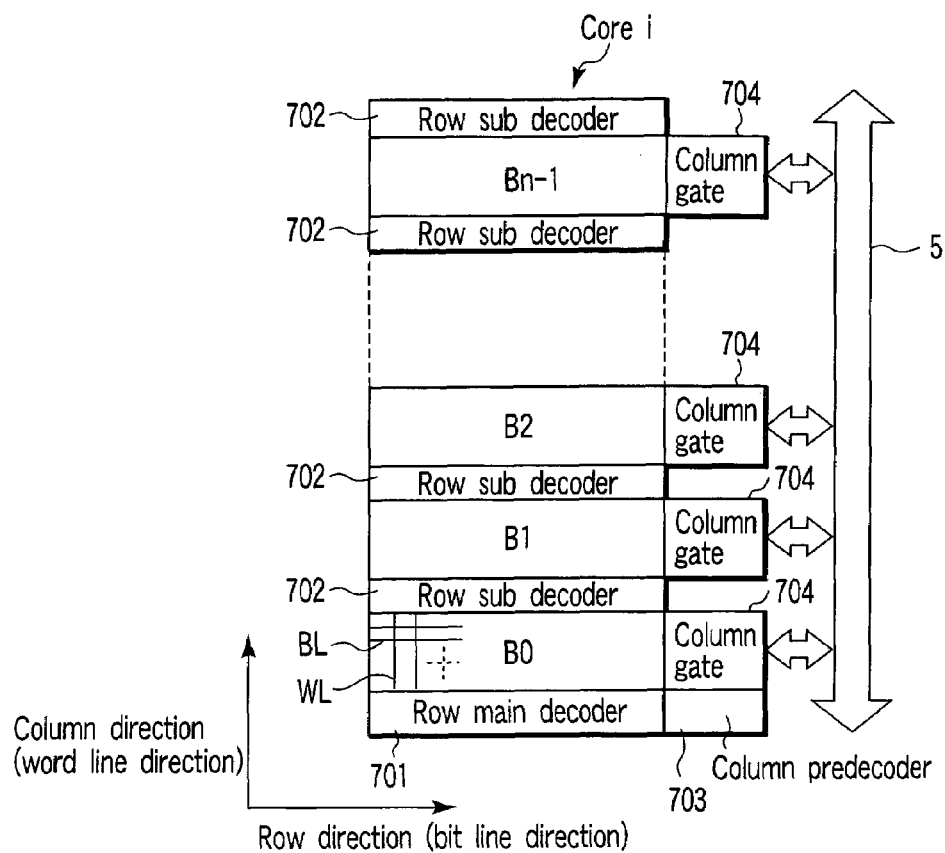
FIG. 2 is a block diagram of a memory cell array in FIG. 1.

FIG. 2 shows the detailed configuration of the memory cell array 1. A row main decoder 701 that selects a word line WL is arranged at the end of the array of the blocks B0 to Bn−1, and row sub decoders 702 that select blocks are arranged among the blocks, respectively. The column decoder is configured by a plurality of column gates 704 arranged at the end of a bit line BL of the respective blocks B0 to Bn−1, the column gates selecting the bit line BL, and a column predecoder 703. Each column gate 704 is connected to the data bus 5. The row main decoder 701 and the column predecoder 703 are arranged in the decode circuit 2 shown in FIG. 1.

Figure 3:
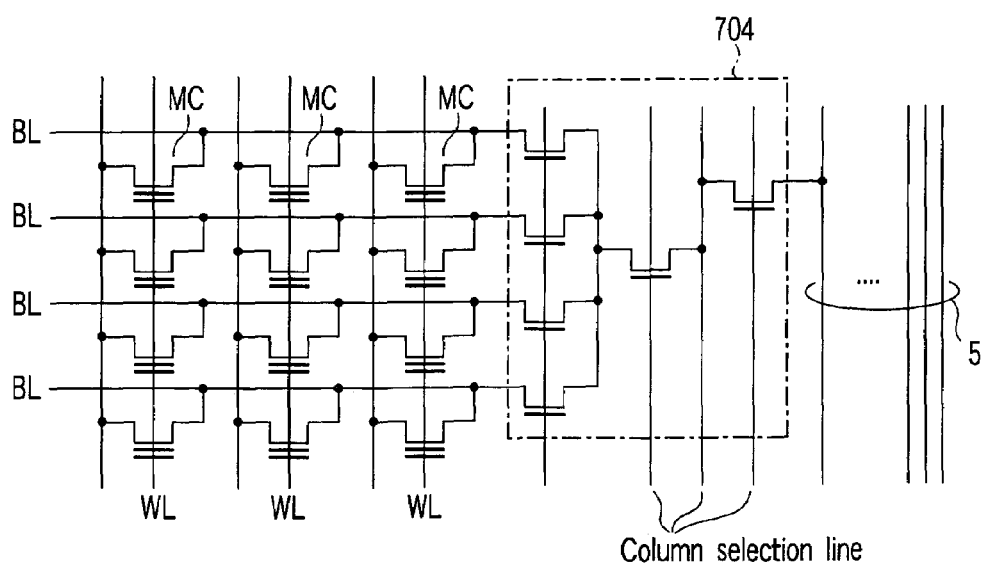
FIG. 3 is a circuit diagram showing the configuration of respective blocks in FIG. 1.

FIG. 3 shows the detailed configuration of the respective blocks B0 to Bn−1. As shown in FIG. 3, the flash memory is, for example, an NOR type flash memory, wherein plural bit lines BL and word lines WL are arranged so as to cross with each other, and a memory cell MC is arranged at the crossing portion of each bit line BL and each word line WL. Each memory cell MC is composed of, for example, an EEPROM cell having a floating gate and a control gate. A drain of the memory cell MC arranged at each column is connected to a corresponding bit line BL, a control gate of the memory cell MC arranged at each row is connected to a corresponding word line WL, and sources are connected to a common source line.

COMPARATIVE EXAMPLE

Figure 4:
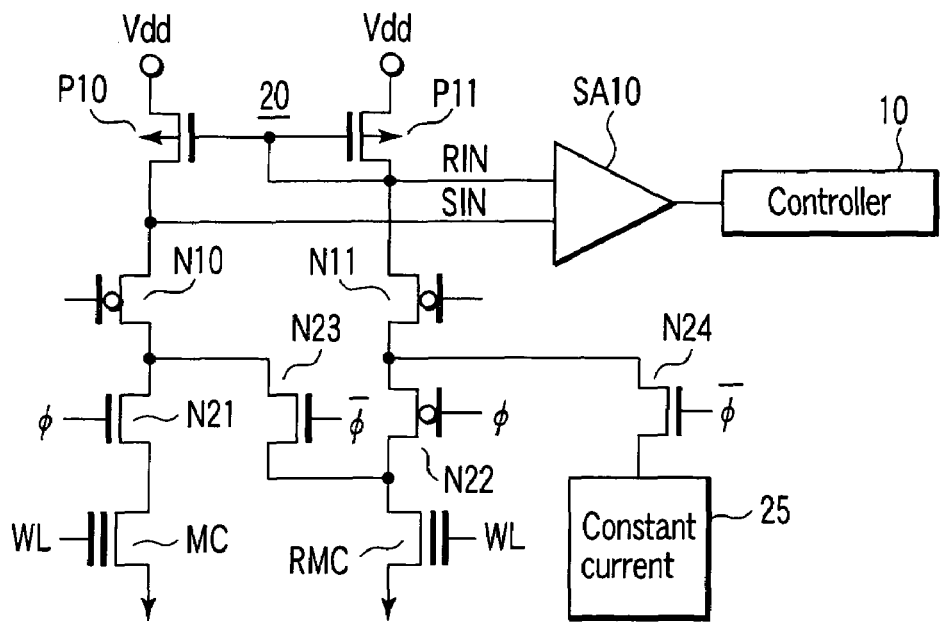
FIG. 4 is a circuit diagram of a flash memory according to a comparative example.

FIG. 4 is a circuit diagram showing the configuration around a sense amplifier in a flash memory described in the specification of Japanese Patent Application No. 2005-114747 proposed by the present inventor. The sense amplifier in FIG. 4 is an Iref direct system sense amplifier, wherein a threshold voltage of a reference memory cell can be adjusted by use of the sense amplifier.

In a flash memory adopting the Iref direct system, the number of reference memory cells to be connected to one sense amplifier increases. For this reason, it is necessary to shorten time required for adjusting the reference memory cell, and compress the fluctuation of threshold voltage.

In the flash memory, it is necessary to complicatedly control values of plural voltages to be supplied to a memory cell at the time of data writing and erasing. Therefore, the flash memory has a controller, and complicated voltage control is performed by use of the controller. By supplying only a command and data to the flash memory from the outside, a required writing or erasing operation is executed. In general, such an operation is referred to as an auto execution.

In the case of the auto execution, the sense amplifier compares a current flowing in a selected main memory cell with a current flowing in the reference memory cell at the time of data writing and erasing, to thereby verify a threshold voltage of the main memory cell. Since the control from the outside is unnecessary in the case of the auto execution, a high-speed operation becomes feasible.

In the circuit in FIG. 4, the adjustment time can be shortened to a great extent by applying the auto execution to the adjustment of the threshold voltage of the reference memory cell. As shown in FIG. 4, an NMOS N21 is connected between an N-channel MOS transistor (hereinafter, referred to as NMOS) N10, and a memory cell (main memory cell) MC which is composed of a non-volatile transistor and whose threshold voltage is adjustable. An NMOS N22 is connected between an NMOS N11, and a reference memory cell RMC which is composed of a non-volatile transistor and whose threshold voltage is adjustable. Further, an NMOS N23 is connected between a connection node of the NMOS N10 and the NMOS N21, and a connection node of the NMOS N22 and the reference memory cell RMC. Furthermore, one end of an NMOS N24 is connected to a connection node of the NMOS N11 and the NMOS N22, and a constant current source circuit 25 is connected to the other end of the NMOS N24.

The sense amplifier SA10 has two input notes. A current mirror type load circuit 20 including two P-channel MOS transistors (hereinafter, referred to shortly as PMOS) P10, P11 is connected between the two input nodes and a supply node of a power source voltage Vdd. A current path between a source and a drain of the PMOS P10 is connected between the node to which the power source voltage Vdd is supplied and an input node SIN at the signal input side of the sense amplifier SA10. A current path between a source and a drain of the PMOS P11 is connected between the node to which the power source voltage Vdd is supplied and an input node RIN at the reference side of the sense amplifier SA10. Gates of the PMOS's P10, P11 are connected in common, and this gate common node is connected to the input node RIN of the sense amplifier SA10. Meanwhile, one end of the NMOS N10 is connected to the input node SIN of the sense amplifier SA10, and one end of the NMOS N11 is connected to the input node RIN of the sense amplifier SA10.

A control signal $\phi$ is supplied to gates of the NMOS's N21, N22, and an inverted control signal $/\phi$ is supplied to gates of the NMOS's N23, N24. The control signals $\phi$, $/\phi$ are generated in the controller 10. In the normal operation, the control signal $\phi$ is set to a High level, and at the time of adjusting the threshold voltage of the reference memory cell RMC, the control signal $/\phi$ is set to a Low level. Further, when the threshold voltage of the reference memory cell RMC is adjusted, an output signal of the sense amplifier SA10 is supplied to the controller 10. Meanwhile, for simplifying the explanation, only one reference memory cell is shown.

The NMOS's N10, N11 in FIG. 4 are transistors whose threshold voltage is set to, for example, 0 V, and to the respective gates thereof, a constant bias voltage for turning on the NMOS's N10, N11 is supplied. Provision of these NMOS's N10 and N11 makes it possible to avoid the power voltage Vdd from being applied directly to the memory cell MC and the reference memory cell RMC.

When a command for adjusting the reference memory cell RMC and data for setting the threshold voltage are supplied from the outside to the controller 10 via the input/output circuit 11, the controller 10 is set to an adjustment mode. Then, the controller 10 sets the control signal $\phi$ to the Low level, and sets the control signal $/\phi$ to the High level. At this time, the NMOS's N21, N22 are turned off, and the NMOS's N23, n24 are turned on. In this state, data writing is performed to the reference memory cell RMC in response to write data. This writing operation is same as the writing operation to the memory cell MC. Subsequently, the sense amplifier SA10 compares a current flowing in the reference memory cell RMC with a current flowing in the constant current source circuit 25. The output signal of the sense amplifier SA10 is supplied to the controller 10, and the threshold voltage of the reference memory cell RMC is verified. If the value does not reach a desired threshold voltage as a result of the verification, additional writing is performed. Such an adjusting operation is repeated until the value reaches the desired threshold voltage. Such an operation is performed on all the reference memory cells connected to the sense amplifier SA10.

Meanwhile, in the two PMOS's P10, P11 configuring the current mirror type load circuit 20, various efforts are made in layouts and processes in order to restrict the fluctuation of the threshold voltage. However, even with these efforts, there will occur fluctuations in the threshold voltage in a practical device.

Figure 5:
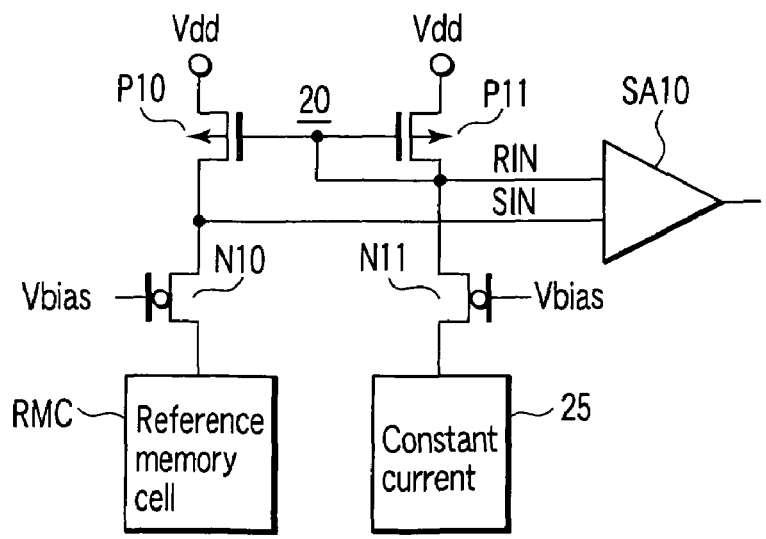
FIG. 5 is an equivalent circuit diagram in FIG. 4 when a threshold voltage of a reference memory cell is adjusted.

FIG. 5 shows an equivalent circuit diagram in FIG. 4 when the threshold voltage of the reference memory cell RMC is verified. A constant bias voltage Vbias is supplied to the gates of the NMOS's N10 and N11.

Figure 6:
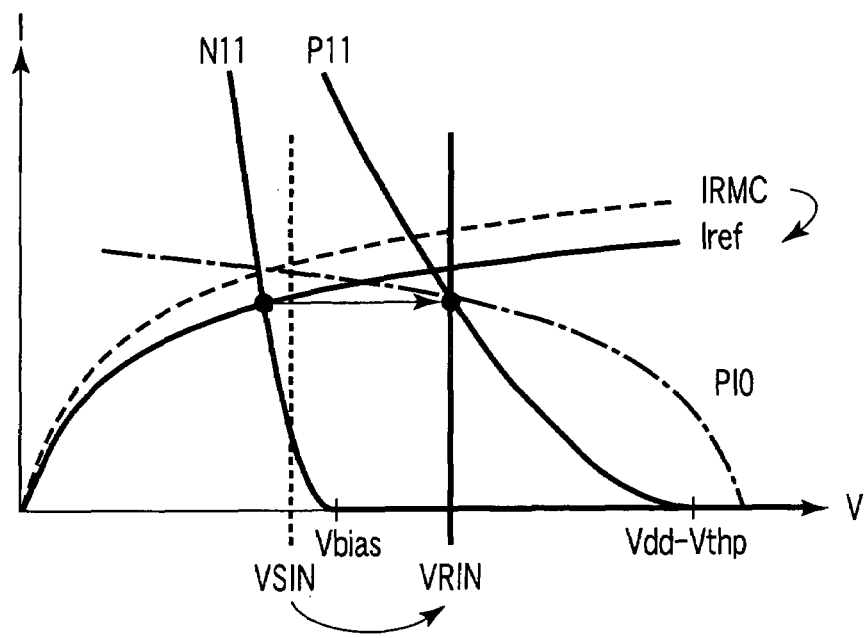
FIG. 6 is a characteristic diagram showing voltage-current characteristics of PMOS's and an NMOS in an ideal state without fluctuation of threshold voltage in the PMOS's in the equivalent circuit in FIG. 5 and changes of currents flowing in a reference memory cell and a constant current source.

FIG. 6 shows voltage-current characteristics of the PMOS's P10, P11 and the NMOS N11 in an ideal state without fluctuation of threshold voltage in the two PMOS's P10, P11 in the equivalent circuit in FIG. 5, and changes of currents IRMC, Iref flowing in the reference memory cell RMC and the constant current source circuit 25. In FIG. 6, Vthp denotes an absolute value of the threshold voltage (negative voltage) of the PMOS's P10, P11.

At the time of the verification operation, a potential of the word line WL connected to the reference memory cell RMC is changed to verify the threshold voltage of the reference memory cell RMC. In other words, after data writing at the verification operation, the current IRMC flowing in the reference memory cell RMC is compared with the current Iref flowing in the constant current source circuit 25. When the values of both the currents IRMC and Iref become equal, voltages VSIN, VRIN of the pair of input nodes SIN, RIN of the sense amplifier SA10 become same, and the output of the sense amplifier SA10 becomes inverted, so that it is detected that the adjustment has been completed.

Figure 7:
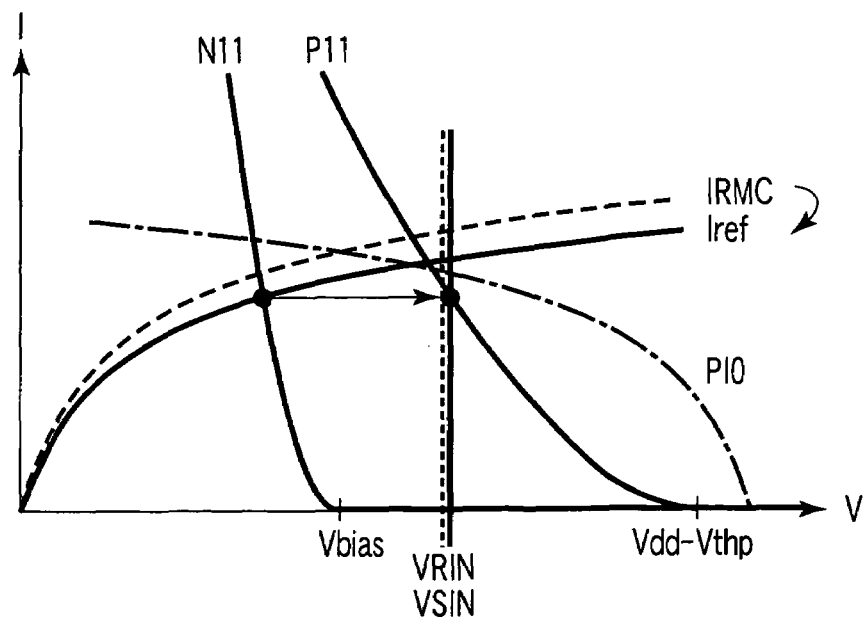
FIG. 7 is a characteristic diagram showing voltage-current characteristics of PMOS's and an NMOS in a state with fluctuation of threshold voltage in the PMOS's in the equivalent circuit in FIG. 5 and changes of currents flowing in a reference memory cell and a constant current source.

FIG. 7 shows voltage-current characteristics of PMOS's P10, P11 and the NMOS N11 in the PMOS's in a state with fluctuation of threshold voltage in the two PMOS's P10, P11 in the equivalent circuit in FIG. 5, and for example, when the absolute value of the threshold voltage of P10 becomes lower than that of the PMOS P11, i.e., when the threshold value of the PMOS P10 becomes shallow, and changes of currents IRMC, Iref flowing in the reference memory cell RMC and the constant current source circuit 25.

When the threshold value of the PMOS P10 becomes shallow, much more current flows into the PMOS P10 than the PMOS P11. Accordingly, in a state where IRMC is larger than Iref, the values of the voltages VSIN, VRIN of the pair of input nodes SIN, RIN of the sense amplifier SA10 become equal, and the output of the sense amplifier SA10 becomes inverted, so that it is detected that the adjustment has been completed.

Figure 8:
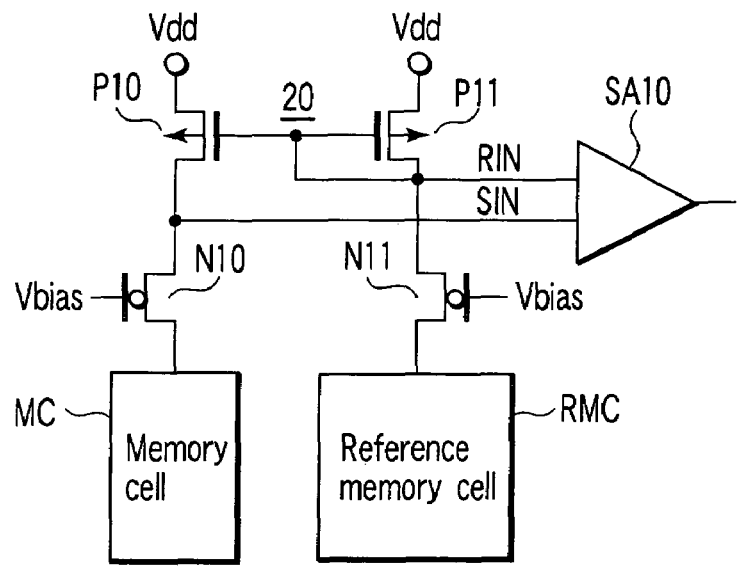
FIG. 8 is an equivalent circuit diagram in FIG. 4 when a threshold voltage of a memory cell is adjusted.
Figure 9:
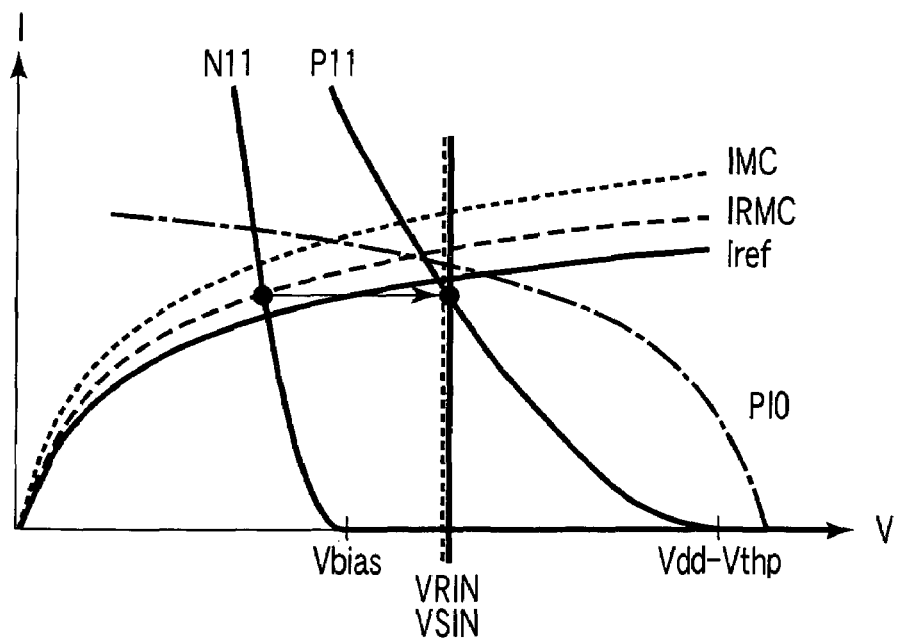
FIG. 9 is a characteristic diagram showing voltage-current characteristics of PMOS's and an NMOS in a state with fluctuation of threshold voltage in the PMOS's in the equivalent circuit in FIG. 5 and changes of currents flowing in a memory cell and a reference memory cell.

In the circuit in FIG. 4, the NMOS's N21, N22 are turned on when the threshold voltage of the memory cell MC is adjusted. FIG. 8 shows an equivalent circuit diagram in FIG. 4 when the threshold voltage of the memory cell MC is adjusted. FIG. 9 shows voltage-current characteristics of the PMOS's P10, P11 and the NMOS N11 at the time of verification, and changes of currents IRMC, IMC flowing in the reference memory cell RMC and the memory cell MC. Note that in FIG. 9, the current Iref flowing in the constant current source circuit 25 when the threshold voltage of the reference memory cell is adjusted is also shown.

Since the threshold value of the PMOS P10 is shallower than that of the PMOS P11, much more current flows into the PMOS P10 than the PMOS P11 also when the threshold voltage of the memory cell MC is adjusted. When IMC is larger than IRMC, the values of the voltages VSIN, VRIN of the pair of input nodes SIN, RIN of the sense amplifier SA10 become equal, and the output of the sense amplifier SA10 becomes inverted, so that it is detected that the adjustment has been completed.

In other words, when fluctuation of the threshold voltage occurs in the two PMOS's P10, p11 configuring the current mirror type load circuit 20, and the threshold value of the PMOS P10 becomes shallow, the adjustment is performed as follows. That is, at the adjustment of the threshold voltage of the reference memory cell RMC, the adjustment is made in a state where the current IRMC flowing in the reference memory cell RMC is more than the current Iref flowing in the constant current source circuit 25. Further, at the adjustment of the threshold voltage of the memory cell MC, the adjustment is made in a state where the current IMC flowing in the memory cell MC is more than the current IRMC flowing in the reference memory cell RMC.

On the contrary to the above, the case where the threshold value of the PMOS P10 becomes deep will be considered. In this case, at the adjustment of the threshold voltage of the reference memory cell RMC, the adjustment is made in a state where the current IRMC flowing in the reference memory cell RMC is less than the current Iref flowing in the constant current source circuit 25. Further, at the adjustment of the threshold voltage of the memory cell MC, the adjustment is made in a state where the current IMC flowing in the memory cell MC is less than the current IRMC flowing in the reference memory cell RMC.

More specifically, when the threshold voltage of the reference memory cell RMC is adjusted on the basis of the current Iref of the constant current source circuit 25, fluctuation occurs in the threshold voltage of the reference memory cell RMC due to the fluctuation of the threshold voltage in the two PMOS's configuring the current mirror type load circuit 20. In addition, when the threshold voltage of the memory cell MC is adjusted on the basis of the fluctuated threshold voltage of the reference memory cell RMC, the fluctuation of the threshold voltage of the memory cell MC becomes very large.

The fluctuation of the threshold voltage that occurs in the two PMOS's configuring the load circuit 20 varies with sense amplifiers. Therefore, for example, when a block as the minimum erasing unit is erased, an erasing operation is executed until the verification passes in the sense amplifier to which the load circuit 20 where the threshold value of the PMOS P10 is shallow is connected. On the other hand, when an excessively erased memory cell is written back, a writing operation is executed until the verification passes in the sense amplifier to which the load circuit 20 where the threshold value of the PMOS P10 is deep is connected.

In other words, the influence of the fluctuation of the threshold voltage occurring in the two PMOS's is received twice at the erasing time, and twice at the writing back time, namely four times in total. For this reason, a distribution width of the threshold voltage after erasing becomes narrow accordingly, and erasing time is prolonged.

Meanwhile, the problem has been described previously that, when the threshold voltage of the reference memory cell is adjusted, the threshold voltage of the reference memory cell fluctuates in response to the fluctuation of the threshold voltage of the two PMOS's configuring the current mirror type load circuit 20 connected to the pair of input terminals of the sense amplifier. Such a problem occurs in the same manner even if a current mirror type load circuit composed of two PMOS's is arranged in the inside of the sense amplifier.

First Embodiment

Figure 10:
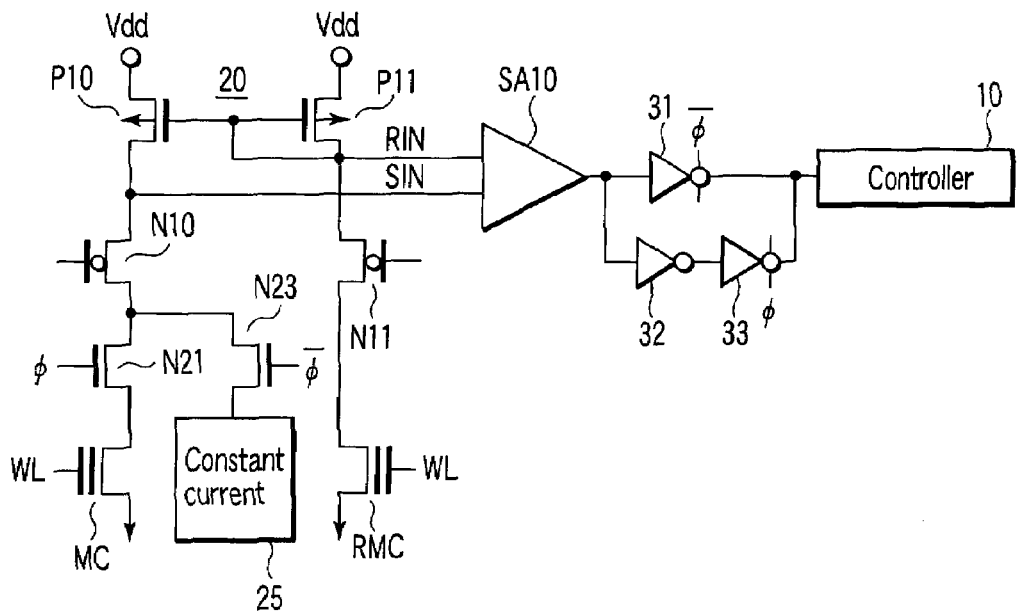
FIG. 10 is a circuit diagram of a flash memory according to a first embodiment.

A flash memory according to the first embodiment is configured so as to suppress the fluctuation of the threshold voltage of the reference memory cell due to the fluctuation of the threshold voltage of the two PMOS's configuring the current mirror type load circuit 20 explained in the comparative example, and to thereby suppress the fluctuation of the threshold voltage of the memory cell. FIG. 10 is a circuit diagram showing the configuration around a sense amplifier in a flash memory according to the first embodiment. Note that the same components as those of the circuit in FIG. 4 are denoted by the same reference numerals, and repeated explanations thereof are omitted and only portions different from FIG. 4 will be explained hereinafter.

As shown in FIG. 10, the reference memory cell RMC is connected directly to the NMOS N11. Further, an NMOS N23 having the control signal /φ supplied to a gate thereof is connected between the connection node of the NMOS's N10 and N21 and the constant current source circuit 25.

Further, a clocked inverter 31 and a series circuit composed of an inverter 32 and a clocked inverter 33 are connected in parallel between the output node of the sense amplifier SA10 and the controller 10. The clocked inverter 31 operates when the control signal /φ is at the High level, and the clocked inverter 33 operates when the control signal φ is at the High level.

When the threshold voltage of the reference memory cell RMC is adjusted, the NMOS N23 is turned on and the NMOS N21 is turned off, on the basis of the control signals φ, /φ generated by the controller 10. When the threshold voltage of the memory cell MC is adjusted, the NMOS N23 is turned off and the NMOS N21 is turned on, on the basis of the control signals φ, /φ generated by the controller 10.

That is, the circuit shown in FIG. 10 is a flash memory including: a memory cell MC which is composed of a non-volatile transistor and whose threshold voltage is adjustable; a reference memory cell RMC which is composed of a non-volatile transistor and whose threshold voltage is adjustable; a sense amplifier SA10 that has first and second input nodes (RIN, SIN), the reference memory cell RMC being coupled to the first input node (RIN); a current mirror type load circuit 20 connected to the first and second input nodes of the sense amplifier SA10; a first transistor N23 having one end coupled to the second input node (SIN) of the sense amplifier SA10; a reference current source circuit 25 connected to the other end of the first transistor N23; and a second transistor N21 having one end coupled to the second input node (SIN), and the other end connected with the memory cell MC. When the threshold voltage of the reference memory cell RMC is adjusted, the first transistor N23 is turned on and the second transistor N21 is turned off, and when the threshold voltage of the memory cell at verification of writing to/erasing from the memory cell MC, the first transistor N23 is turned off and the second transistor N21 is turned on.

When a command for adjusting the reference memory cell RMC and data for setting the threshold voltage are supplied from the outside to the controller 10 via the input/output circuit 11, the controller 10 is set to an adjustment mode. The controller 10 inverts the control signal φ to the Low level, and inverts the control signal /φ to the High level. At this time, the NMOS N21 is turned off, and the NMOS N23 is turned on. In this state, data writing is performed to the reference memory cell RMC in response to write data. Subsequently, the sense amplifier SA10 compares a current flowing in the reference memory cell RMC with a current flowing in the constant current source circuit 25. An output signal of the sense amplifier SA10 is supplied to the controller 10, and the threshold voltage of the reference memory cell RMC is verified. If the value does not reach a desired threshold voltage as a result of the verification, additional writing is performed. Such an adjusting operation is repeated until the value reaches the desired threshold voltage. Such an operation is performed on all the reference memory cells connected to the sense amplifier SA10.

Figure 11:
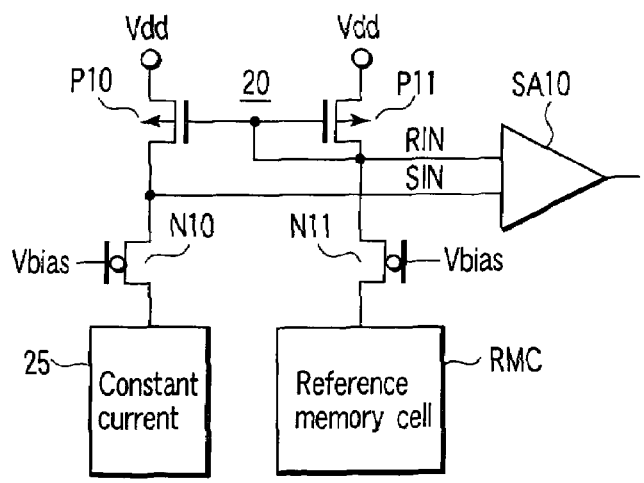
FIG. 11 is an equivalent circuit diagram in FIG. 10 when a threshold voltage of a reference memory cell is adjusted.

FIG. 11 shows an equivalent circuit in FIG. 10 when the threshold voltage of the reference memory cell RMC is verified. A constant bias voltage Vbias is supplied to gates of the NMOS's N10 and N11.

At the time of the verification operation, a potential of the word line WL connected to the reference memory cell RMC is changed to verify the threshold voltage of the reference memory cell RMC. In other words, after data writing at the verification operation, a current IRMC flowing in the reference memory cell RMC is compared with a current Iref flowing in the constant current source circuit 25. When the values of both the currents IRMC and Iref become equal, the voltages VSIN, VRIN of the pair of input nodes SIN, RIN of the sense amplifier SA10 become same, and the output of the sense amplifier SA10 becomes inverted, so that it is detected that the adjustment has been completed.

Figure 12:
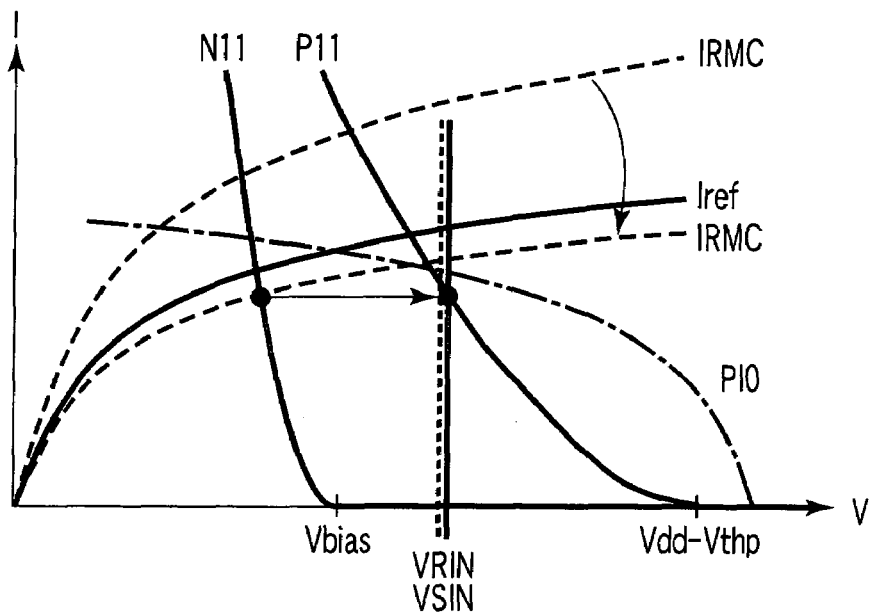
FIG. 12 is a characteristic diagram showing voltage-current characteristics of PMOS's and an NMOS in a state with fluctuation of threshold voltage in the PMOS's in the equivalent circuit in FIG. 11 and changes of currents flowing in a reference memory cell and a constant current source.

FIG. 12 shows voltage-current characteristics of PMOS's P10, P11 and the NMOS N11 in the PMOS's in a state with fluctuation of threshold voltage in the two PMOS's P10, P11 in the equivalent circuit in FIG. 11, and for example, when an absolute value of the threshold voltage of P10 becomes lower than that of the PMOS P11, i.e., when the threshold value of the PMOS P10 becomes shallow, and changes of the currents IRMC, Iref flowing in the reference memory cell RMC and the constant current source circuit 25.

When the threshold value of the PMOS P10 becomes shallow, much more current flows into the PMOS P10 than the PMOS P11. For this reason, in a state where IRMC is smaller than Iref by the fluctuation of the threshold voltage of the PMOS's P10 and P11, the values of the voltages VSIN, VRIN of the pair of input nodes SIN, RIN of the sense amplifier SA10 become equal, and the output of the sense amplifier SA10 becomes inverted, so that it is detected that the adjustment has been completed.

Figure 13:
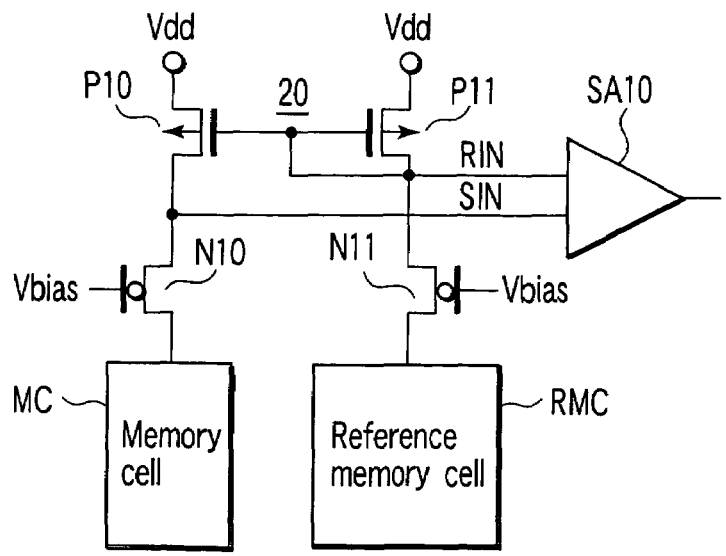
FIG. 13 is an equivalent circuit diagram in FIG. 10 when a threshold voltage of a memory cell is adjusted.
Figure 14:
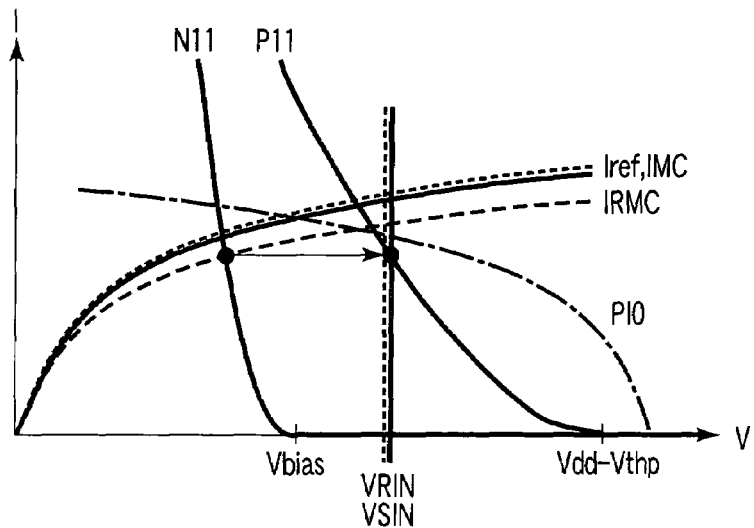
FIG. 14 is a characteristic diagram showing voltage-current characteristics of PMOS's and an NMOS in a state with fluctuation of threshold voltage in the PMOS's in the equivalent circuit in FIG. 13 and changes of currents flowing in a memory cell and a reference memory cell.

Next, in order to adjust the threshold voltage of the memory cell MC, the NMOS N21 in FIG. 10 is turned on, and N23 is turned off. FIG. 13 shows an equivalent circuit in FIG. 10 when the threshold voltage of the memory cell MC is adjusted. FIG. 14 shows voltage-current characteristics of the PMOS's P10, P11 and the NMOS N11 at the adjusting, and changes of currents IRMC, IMC flowing in the reference memory cell RMC and the memory cell MC. In FIG. 14, the current Iref that flows in the constant current source circuit 25 at the adjustment of the threshold voltage of the reference memory cell RMC is also shown.

Since the threshold value of the PMOS P10 is shallower than that of the PMOS P11, much more current flows into the PMOS P10 than the PMOS P11 when the threshold voltage of the memory cell MC is adjusted. In a state where IMC is larger than IRMC, the values of the voltages VSIN, VRIN of the pair of input nodes SIN, RIN of the sense amplifier SA10 become equal, and the output of the sense amplifier SA10 becomes inverted, so that it is detected that the adjustment has been completed.

In other words, in the case where fluctuation of the threshold voltage occurs in the two PMOS's P10, P11 configuring the current mirror type load circuit 20, and the threshold value of the PMOS P10 becomes shallow, the adjustment is made in a state where the current IRMC flowing in the reference memory cell RMC is less than the current Iref flowing in the constant current source circuit 25 when the threshold voltage of the reference memory cell RMC is adjusted. When the threshold voltage of the memory cell MC is adjusted, on the other hand, the adjustment is made in a state where the current IMC flowing in the memory cell MC is more than the current IRMC flowing in the reference memory cell RMC.

On the contrary to the above, the case where the threshold value of the PMOS P10 becomes deep is considered. In this case, when the threshold voltage of the reference memory cell RMC is adjusted, the adjustment is made in a state where the current IRMC flowing in the reference memory cell RMC is more than the current Iref flowing in the constant current source circuit 25. Further, when the threshold voltage of the memory cell MC is adjusted, the adjustment is made in a state where the current IMC flowing in the memory cell MC is less than the current IRMC flowing in the reference memory cell RMC.

In other words, when the threshold voltage of the reference memory cell RMC is adjusted, the threshold voltage of the reference memory cell RMC is adjusted in such a manner that there is a current difference between the current Iref and the current IRMC flowing in the reference memory cell RMC, in accordance to the fluctuation of the threshold voltage of two PMOS's configuring the current mirror type load circuit 20.

In addition, when the threshold voltage of the memory cell MC is adjusted, the threshold voltage of the memory cell MC is adjusted in such a manner that there is a current difference between the current IRMC and the current IMC flowing in the memory cell MC, in accordance to the fluctuation of the threshold voltage of two PMOS's configuring the load circuit 20, and in a direction to eliminate the current difference.

As a result, the threshold voltage of the memory cell MC is adjusted such that the current IMC flowing in the memory cell MC is equal to the current Iref flowing in the constant current source circuit 25. Then, the threshold voltage of the memory cell MC based on the threshold voltage of the PMOS's P10, P11 is corrected in a self-aligning manner per sense amplifier.

Meanwhile, when the threshold voltage of the reference memory cell RMC is adjusted, the connection relation of the reference memory cell RMC and the constant current source circuit 25 to the sense amplifier SA10 becomes opposite to that in FIG. 4, and an output expected value of the sense amplifier becomes the opposite level to that in FIG. 4. For this reason, the circuit in FIG. 10 is designed such that, when the threshold voltage of the reference memory cell RMC is adjusted, the clocked inverter 31 is operated to supply the output of the sense amplifier SA10 in its inverted state to the controller 10. Further, when the threshold voltage of the memory cell MC is adjusted, the connection relation of the reference memory cell RMC and the memory cell MC to the sense amplifier SA10 becomes same as in FIG, 4. Accordingly, in this case, the clocked inverter 33 is operated to supply the output of the sense amplifier SA10, inverted twice, to the controller 10.

As described above, according to the first embodiment, the auto execution of the flash memory is applied to the adjustment of the reference memory cell. Therefore, it is possible to greatly shorten the time required for adjusting the threshold voltage of the reference memory cell. As a consequence, in the case where an Iref direct system sense amplifier is to be applied to a multiple-value flash memory, it is possible to greatly shorten the time required for adjusting the reference memory cell even if the number of reference memory cells increases.

Further, according to the first embodiment, the sense amplifier that detects data of the memory cell can be used for the adjustment of the threshold voltage of the reference memory cell. For this reason, there is no need to provide an exclusive sense amplifier for adjusting the threshold voltage of the reference memory cell. Accordingly, it is possible to suppress area penalty.

Moreover, the first embodiment has also the following advantage. That is, even when there occurs a fluctuation in the threshold voltage of a pair of transistors configuring the current mirror type load circuit 20, it is possible to correct the fluctuations of the threshold voltages of the reference memory cell and the memory cell arising from this fluctuation in the threshold voltage in a self-aligning manner per sense amplifier.

Figure 15:
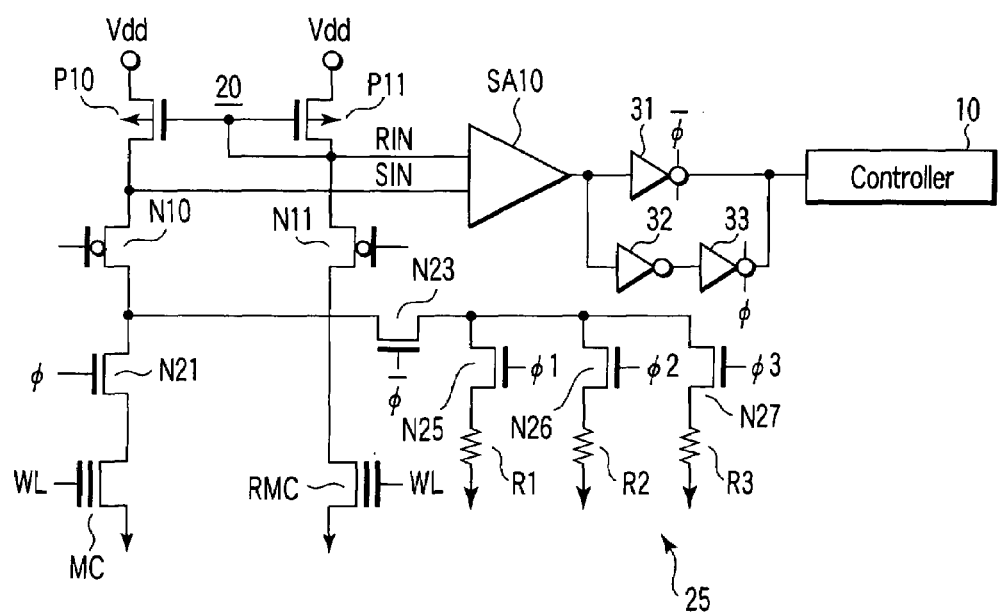
FIG. 15 is a circuit diagram of an embodied constant current source circuit in FIG. 10.

FIG. 15 shows a concrete circuit configuration of the constant current source circuit 25 shown in FIG. 10 together with other circuit. The constant current source circuit 25 is configured by three resistors R1, R2 and R3 having mutual different resistance values for setting three different current values, and three NMOS's N25, N26 and N27 that select the resistors R1, R2 and R3. Signals $\phi1$, $\phi2$ and $\phi3$ are supplied to gates of the three NMOS's N25, N26 and N27. Resistance values of the resistors R1, R2 and R3 are set according to a threshold voltage set to the reference memory cell RMC, in other words, a value of current to be made to flow in the reference memory cell RMC.

In such a configuration, according to a threshold voltage to be set to the reference memory cell RMC, one of the signals $\phi1$, $\phi2$ and $\phi3$ is set to the High level, and the corresponding one of the NMOS's N25, N26 and N27 is turned on. In this state, the sense amplifier SA10 detects a current flowing in the reference memory cell RMC, and a current flowing in the selected resistor. On the basis of the detection output signal, an additional writing operation is controlled, and a desired threshold voltage is set to the reference memory cell RMC. Note that the present embodiment describes a case where the NMOS N23 is connected in series to the NMOS's N25, N26 and N27, respectively. However, the NMOS N23 may be omitted, and the function of the NMOS N23 may be provided in the NMOS's N25, N26 and N27, respectively. Specifically, signals obtained by taking the logical sum of the control signal $\phi$ and the control signals $\phi1$, $\phi2$ and $\phi3$ may be supplied to the gates of the NMOS's N25, N26 and N27.

Second Embodiment

Figure 16:
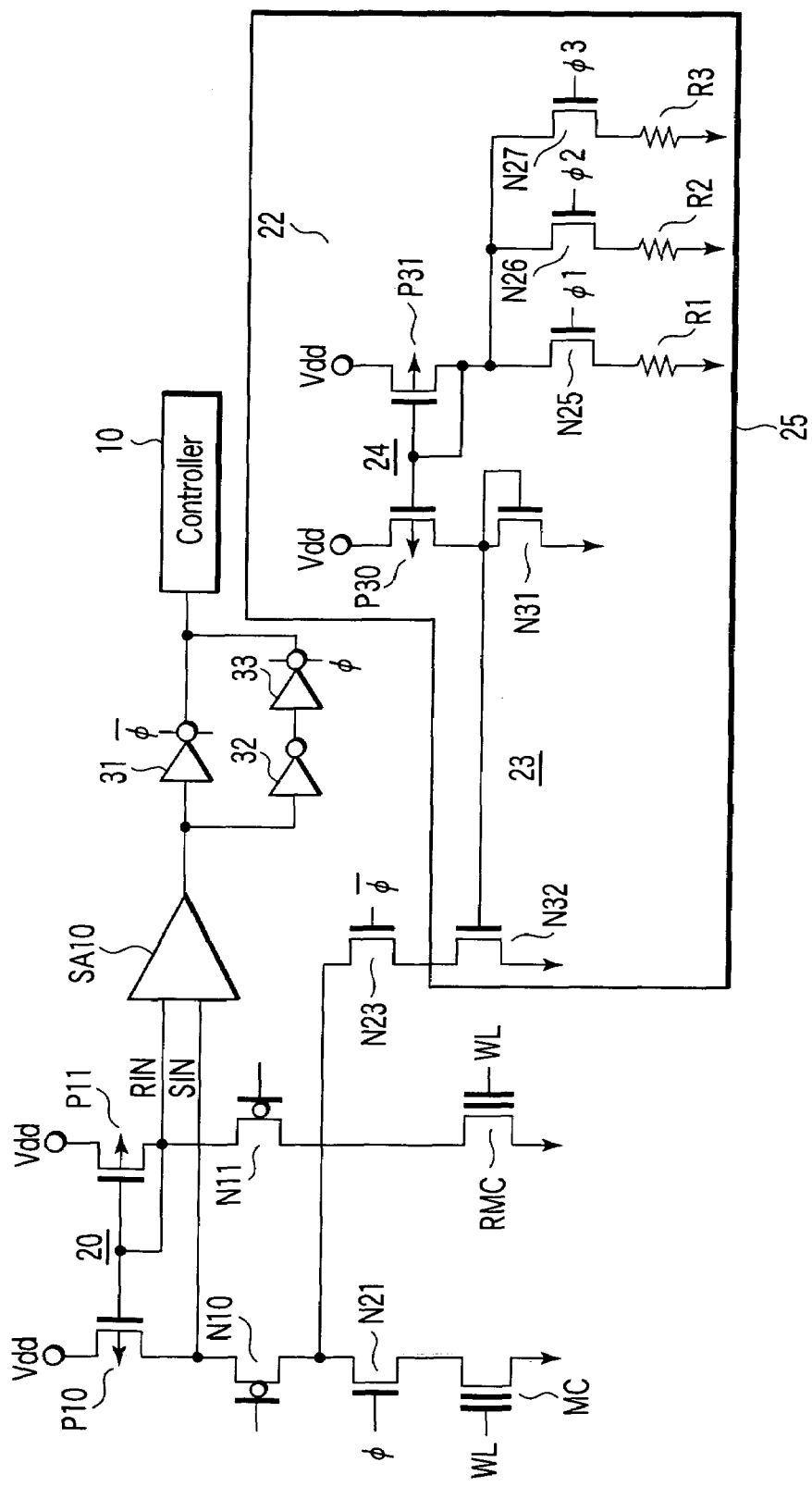
FIG. 16 is a circuit diagram of a flash memory according to a second embodiment.

FIG. 16 shows a flash memory according to the second embodiment, and the same components as those in FIG. 15 are denoted by the same reference numerals.

Normally, a flash memory has plural sense amplifiers. Therefore, as shown in FIG. 15, if plural resistors (R1, R2, R3) are provided for each sense amplifier, the area penalty becomes very large. Thus, in the second embodiment, a reference current generation circuit 22 is provided at one portion in a flash memory, so that a reference current is supplied from the reference current generation circuit 22 to the plural sense amplifiers. A constant current source circuit 25 has the reference current generation circuit 22, and a current mirror circuit 23 that supplies the reference current output from the reference current generation circuit 22 to the NMOS N23. The current mirror circuit 23 is composed of, for example, NMOS's N31 and N32.

As shown in FIG. 16, the reference current generation circuit 22 is configured by three resisters R1, R2 and R3, three NMOS's N25, N26 and N27 that select these three resistors R1, R2 and R3, and a current mirror circuit 24 composed of PMOS's P30 and P31. A current that is generated by the reference current generation circuit 22, and equivalent to a reference current flowing in each reference memory cell is output from the drain side of the PMOS P30 configuring the current mirror circuit 24. The reference current is supplied to the current mirror circuit 23, and a current in proportion to the reference current is made to flow in the NMOS N32. The NMOS N32 functions as a constant current source that applies a constant current to the NMOS N23.

In the above configuration, when the reference memory cell RMC is set in a threshold voltage adjustment mode according to a test command, the control signal $\phi$ becomes the Low level and the control signal /$\phi$ becomes the High level. Consequently, the NMOS N32 is connected via the NMOS's N10 and N23 to the input node SIN of the signal input side of the sense amplifier SA10. To the input node RIN at the reference side, the reference memory cell RMC is connected via the NMOS N11.

Further, according to a threshold voltage to be adjusted to the reference memory cell RMC, one of the three NMOS's N25, N26 and N27 is turned on, and one of the three resistors R1, R2 and R3 is selected. In this state, writing is performed to the reference memory cell RMC, and the sense amplifier SA10 detects the current flowing in the reference memory cell RMC and the current flowing in the selected resistor. This operation is repeated until the current flowing in the reference memory cell RMC and the current flowing in the selected resistor become equal.

According to the second embodiment, one reference current generation circuit 22 is provided in a flash memory, and the current generated by the reference current generation circuit 22 is supplied to the plural sense amplifiers. For this reason, in the comparison with the case where plural resistors are connected to each sense amplifier, it is possible to suppress the area penalty dramatically.

Note in the reference current generation circuit 22 using the current mirror circuit, the current margin may vary with fluctuations of temperature and voltage. However, since the adjustment of the reference memory cell RMC is carried out in test process, it is possible to control the fluctuations of temperature and voltage, and accordingly, it is possible to secure the current margin.

Third Embodiment

In the above second embodiment, there will occur fluctuations in the resistance values in the resistors R1, R2 and R3 even if resistors that are precisely set sufficiently are used. Therefore, a desired current value cannot always be attained due to manufacturing conditions of resistors.

Figure 17:
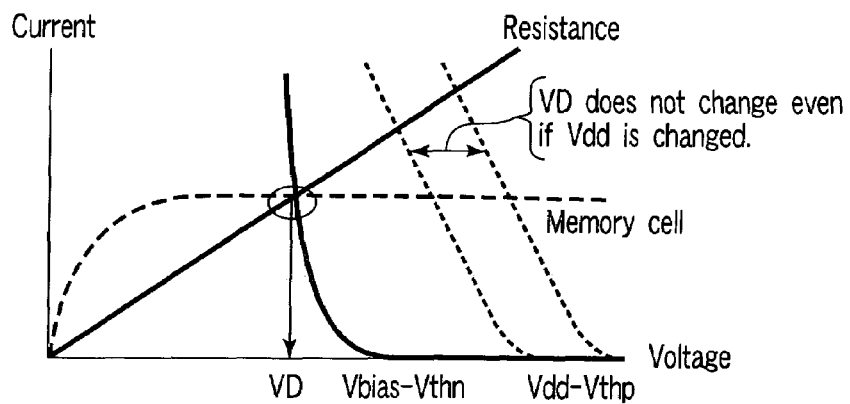
FIG. 17 is a characteristic diagram showing the relation between a voltage and a reference current which are supplied to the sense amplifier shown in FIG. 16.

FIG. 17 shows the relation between a voltage and a value of a reference current supplied to the sense amplifier SA10 shown in FIG. 16. In the circuit shown in FIG. 15, an NMOS N10 having a bias voltage Vbias supplied to a gate thereof is inserted between the node to which the power source voltage Vdd is supplied, and the resistors R1, R2, R3. For this reason, even though the value of the power source voltage Vdd is controlled, a voltage VD that is applied to the resistors R1, R2, R3 is determined by the NMOS having the bias voltage Vbias supplied to the gate thereof. Accordingly, in the case where the resistance values of the resistors R1, R2 and R3 fluctuate, it is difficult to adjust the value of the reference current from the outside.

Figure 18:
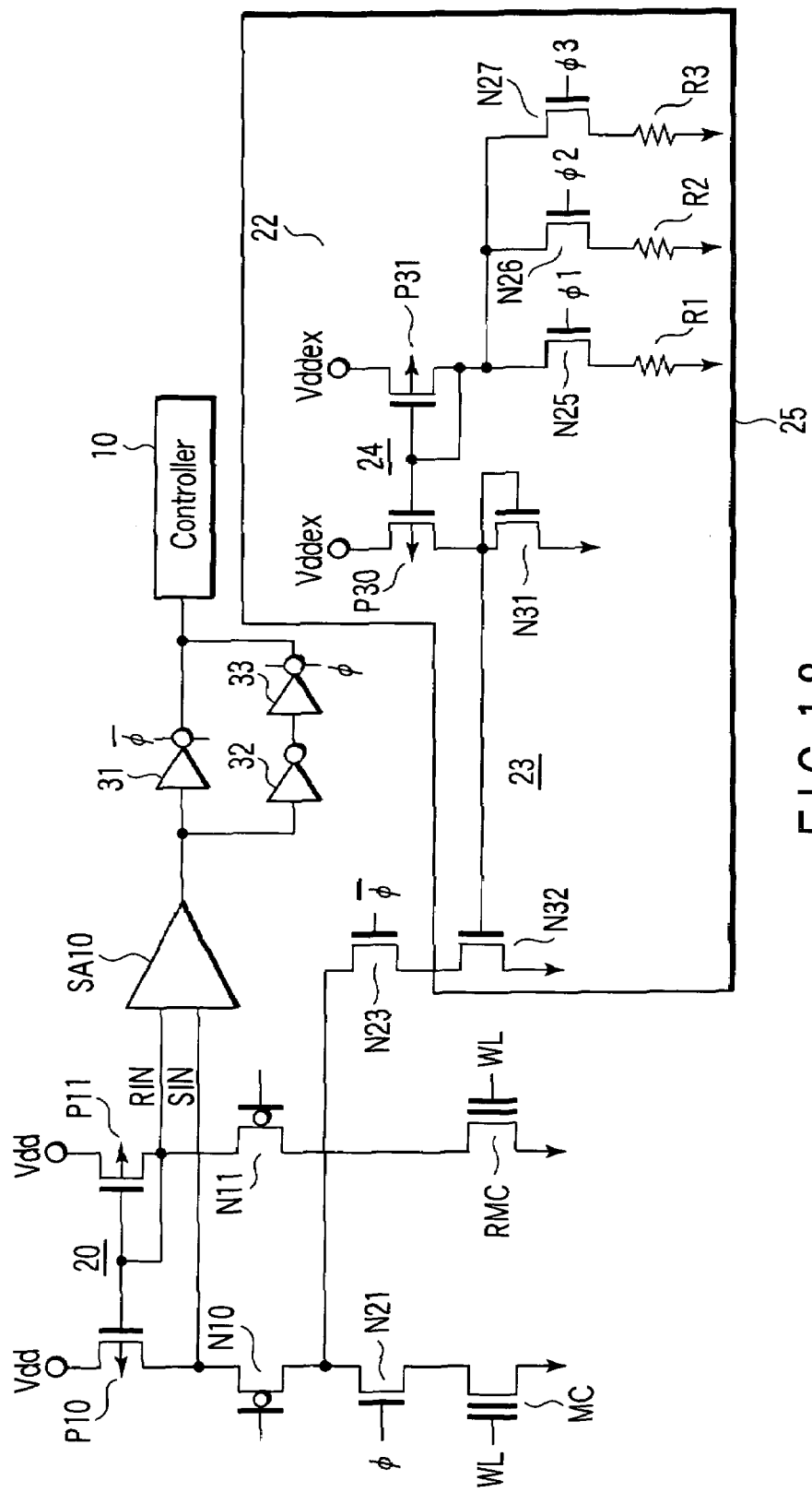
FIG. 18 is a circuit diagram showing the partial configuration of a flash memory according to a third embodiment.

Thus, in the third embodiment, as shown in FIG. 18, a power source voltage Vddex that is separated from the power voltage Vdd to be used in the peripheral circuits including the sense amplifier SA10 is supplied to the reference current generation circuit 22. Specifically, in the reference current generation circuit 22, the power source voltage Vddex is supplied in the place of the power source voltage Vdd to the current mirror circuit 24 composed of the PMOS's P30 and P31.

In the above configuration, the current flowing in the reference current generation circuit 22 is measured. If the reference current value fluctuates due to the fluctuation of the resistance values of the resistors R1, R2 and R3, the value of the power source voltage Vddex is controlled from the outside. By arranging such a configuration, it is possible to set the reference current value at a desired current value even if there are fluctuations in the resistance values of the resistors R1, R2 and R3.

Figure 19:
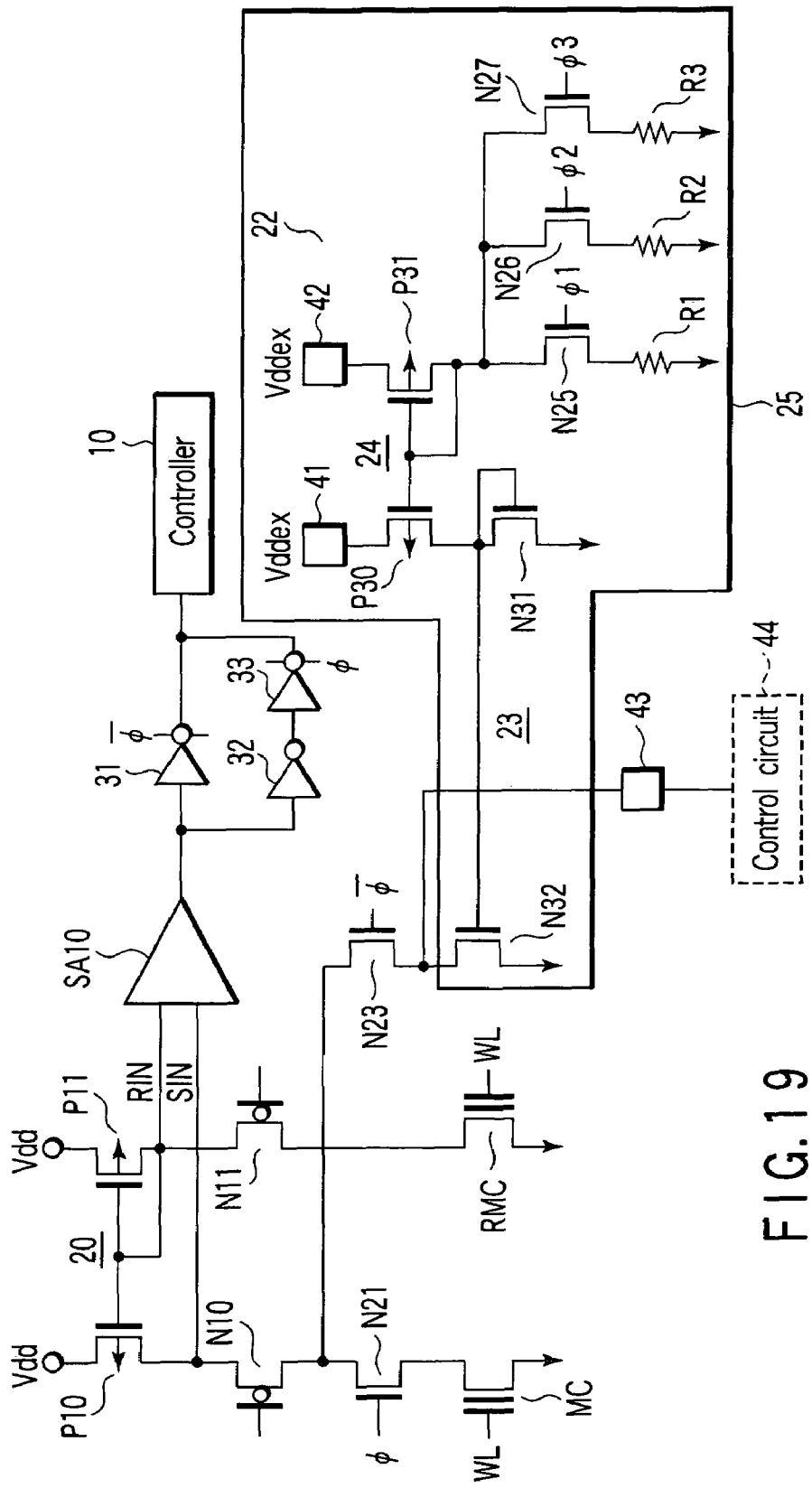
FIG. 19 is a circuit diagram of a flash memory according to a modified example of the third embodiment.

FIG. 19 shows a modified example of the third embodiment. The same components as those in FIG. 18 are denoted by the same reference numerals. The modified example shows a case where the power source voltage Vddex is supplied from test pads (external terminals) 41, 42 for supplying test signals. Further, a connection node of the NMOS's N23 and N32 are connected to a test pad (external terminal) 43. Meanwhile, the power source voltage Vddex may be supplied via one test pad for supplying test signals.

According to the configuration, an external control circuit 44 is connected to the test pad 43, whereby what a degree of current flows in a selected resistor according to the power source voltage Vddex can be monitored at the outside when the reference memory cell RMC is adjusted. The control circuit 44 controls the value of the power source voltage Vddex according to the monitored current value. Accordingly, even when there is fluctuation in the resistance value, it is possible to precisely control the threshold voltage of the reference memory cell RMC.

Further, by supplying the power source voltage Vddex from the test pad, the number of pads can be reduced.

Meanwhile, in the flash memories according to the first, second and third embodiments and the modified example of the third embodiment, the case has been explained in which the current mirror type load circuit composed of two PMOS's is connected to one pair of input nodes of the sense amplifier. However, the present invention may be applied also to a flash memory in which a current mirror type sense amplifier is provided. Hereinafter, description will be given to various embodiments in which the current mirror type load circuit is provided in the inside of the sense amplifier.

Fourth Embodiment

Figure 20:
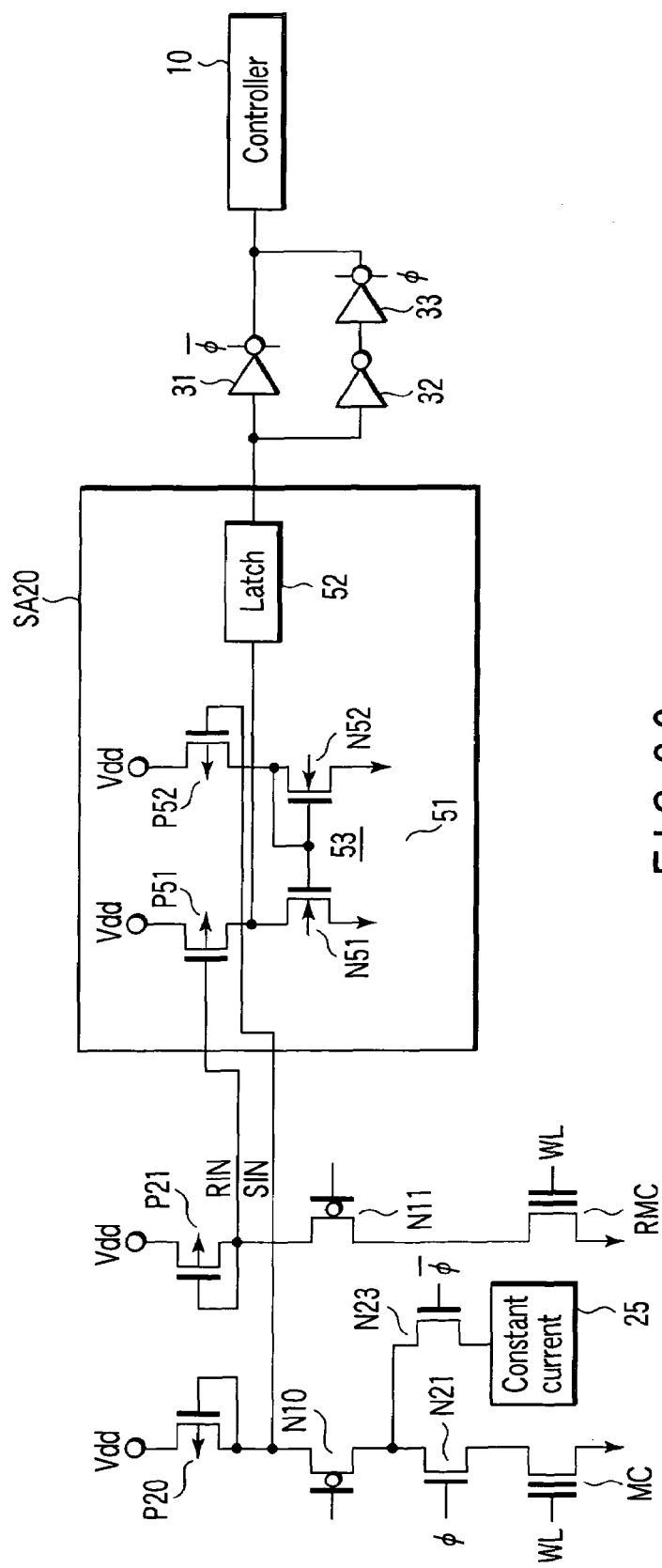
FIG. 20 is a circuit diagram of a flash memory according to a fourth embodiment.

FIG. 20 is a circuit diagram showing the configuration around a sense amplifier of a flash memory according to the fourth embodiment. Note that the circuit shown in FIG. 20 is different from the circuit according to the first embodiment shown in FIG. 10 in that as the load circuit of the memory cell MC and the reference memory cell RMC, two PMOS's P20 and P21 for load are used in the place of the current mirror type load circuit 20, and that a current mirror type sense amplifier SA20 is used in the place of the sense amplifier SA10. Accordingly, the same components as those in FIG. 10 are denoted by the same reference numerals, and repeated explanations thereof are omitted and only portions different from FIG. 10 will be explained hereinafter.

A source of the PMOS P20 is connected to the supply node of the power source voltage Vdd, and gate and drain thereof are connected to an input node SIN at the signal input side of the sense amplifier SA20. A source of the PMOS P21 is connected to the supply node of the power source voltage Vdd, and gate and drain thereof are connected to an input node RIN at the reference side of the sense amplifier SA20.

The sense amplifier SA20 has, for example, a differential amplifier 51 and a latch circuit 52. The differential amplifier 51 has two PMOS's P51 and P52 for driving, and a current mirror circuit 53 including two NMOS's N51 and N52. A source of the driving PMOS P51 is connected to the supply node of the power source voltage Vdd, and a gate thereof is connected to the input node RIN. A source of the driving PMOS P52 is connected to the supply node of the power source voltage Vdd, and a gate thereof is connected to the input node SIN. A source of the NMOS N51 is connected to a supply node of a ground voltage, and a drain thereof is connected to the drain of the PMOS P51. A source of the NMOS N52 is connected to the supply node of the ground voltage, and a drain thereof is connected to the drain of the PMOS P52. Further, the gates of the NMOS's N51 and N52 are connected in common, and this gate common connection node is connected in common to the drain of the PMOS P52. Thereby, sensed data is output from the common drain of the PMOS P51 and the NMOS N51, and the sense data is supplied to the latch circuit 52 to be latched.

More specifically, the circuit shown in FIG. 20 is a flash memory including: a memory cell MC which is composed of a non-volatile transistor and whose threshold voltage is adjustable; a reference memory cell RMC which is composed of a non-volatile transistor and whose threshold voltage is adjustable; a current mirror type sense amplifier SA20 which has first, second input nodes (RIN, SIN), the reference memory cell RMC being coupled to the first input node (RIN); a first transistor N23 having one end coupled to the second input node (SIN) of the sense amplifier SA20; a reference current source circuit 25 connected to the other end of the first transistor N23; and a second transistor N21 having one end coupled to the second input node (SIN) of the sense amplifier, and the other end connected with the memory cell MC. When the threshold voltage of the reference memory cell RMC is adjusted, the first transistor N23 is turned on and the second transistor N21 is turned off, and when the threshold voltage of the memory cell is adjusted at verification of writing to/erasing from the memory cell MC, the first transistor N23 is turned off and the second transistor N21 is turned on.

In the same manner as explained previously, when there occur fluctuations of the threshold voltages in the two NMOS's N51 and N52 configuring the current mirror circuit 53, the fluctuation of the threshold voltage of the memory cell becomes large.

In this flash memory according to the fourth embodiment, the adjustment is performed as follows in the same manner as in the flash memory according to the first embodiment. That is, when the threshold voltage of the reference memory cell RMC is adjusted, the threshold voltage of the reference memory cell RMC is adjusted such that there is a current difference between the current Iref and the current IRMC flowing in the reference memory cell RMC, in accordance to the fluctuation of the threshold voltage of the two NMOS's N51 and N52 configuring the current mirror circuit 53. In addition, when the threshold voltage of the memory cell MC is adjusted, the threshold voltage of the memory cell MC is adjusted such that there is a current difference between the current IRMC and the current IMC flowing in the memory cell MC, in accordance to the fluctuation of the threshold voltage of the two NMOS's N51 and N52, and in a direction to eliminate the current difference.

As a result, the threshold voltage of the memory cell MC is adjusted such that the current IMC flowing in the memory cell MC is equal to the current Iref flowing in the constant current source circuit 25, and the threshold voltage of the memory cell MC based on the threshold voltage of the NMOS's N51 and N52 is corrected in a self-aligning manner per sense amplifier.

Fifth Embodiment

Figure 21:
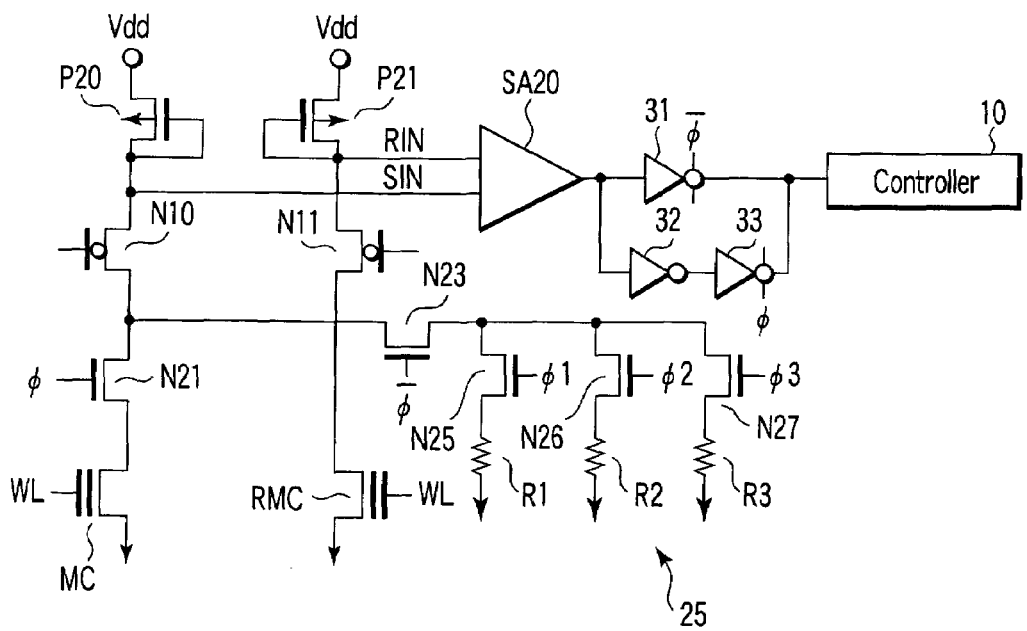
FIG. 21 is a circuit diagram of a flash memory according to a fifth embodiment.

FIG. 21 is a circuit diagram showing the configuration around a sense amplifier of a flash memory according to a fifth embodiment. Note that the circuit shown in FIG. 21 is different from the circuit according to the second embodiment shown in FIG. 15 in that as the load circuit of the memory cell MC and the reference memory cell RMC, two PMOS's P20 and P21 for load are used in the place of the current mirror type load circuit 20, and that a current mirror type sense amplifier SA20 is used in the place of the sense amplifier SA10.

In the present embodiment as well, the threshold voltage of the memory cell MC is adjusted such that the current IMC flowing in the memory cell MC is equal to the current Iref flowing in the constant current source circuit 25, and the threshold voltage of the memory cell MC based on the threshold voltage of the NMOS's N51 and N52 is corrected in a self-aligning manner per sense amplifier.

Sixth Embodiment

Figure 22:
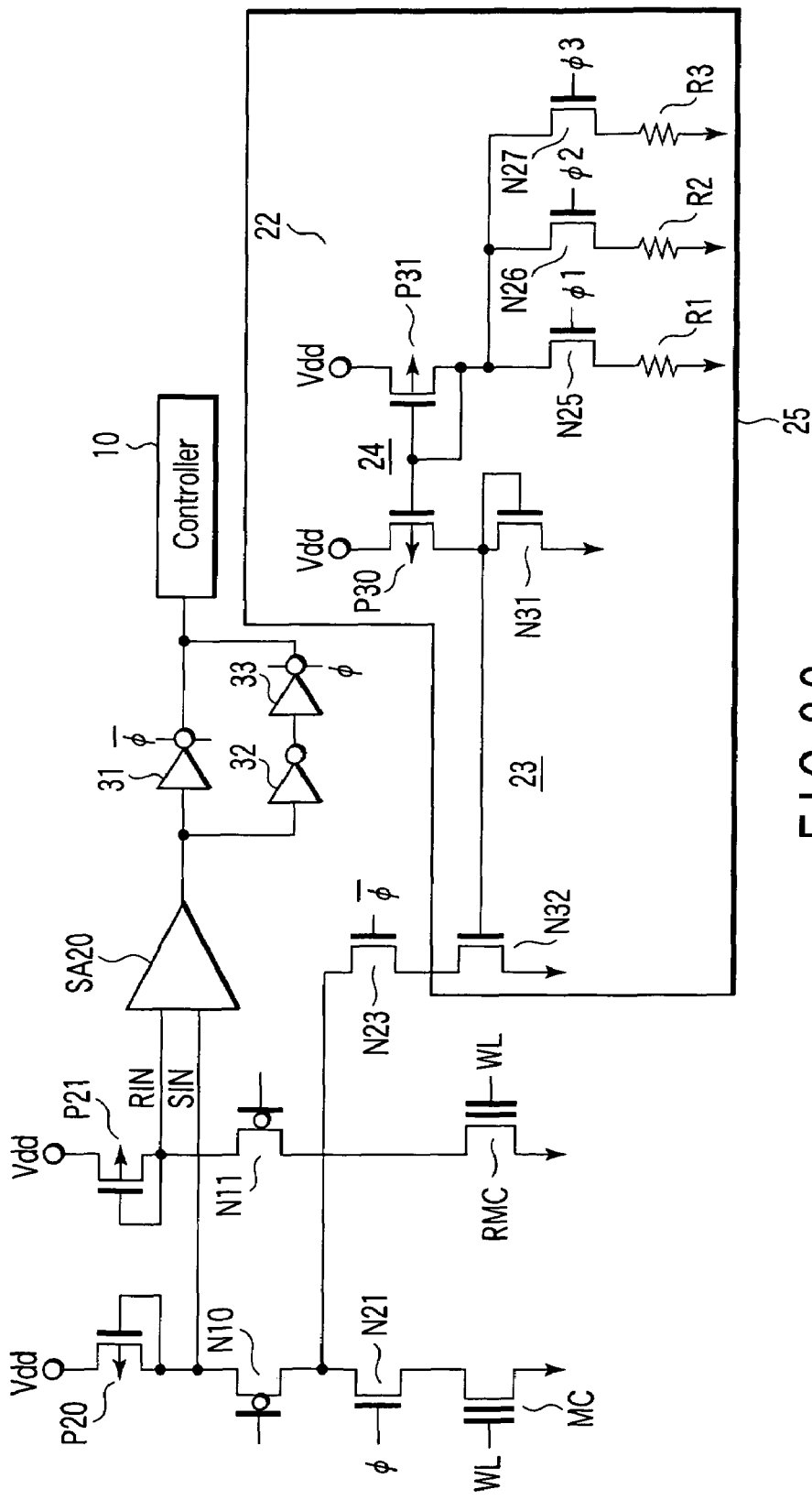
FIG. 22 is a circuit diagram of a flash memory according to a sixth embodiment.

FIG. 22 is a circuit diagram showing the configuration around a sense amplifier of a flash memory according to a sixth embodiment. Note that the circuit shown in FIG. 22 is different from the circuit according to the third embodiment shown in FIG. 16 in that as the load circuit of the memory cell MC and the reference memory cell RMC, two PMOS's P20 and P21 for load are used in the place of the current mirror type load circuit 20, and that a current mirror type sense amplifier SA20 is used in the place of the sense amplifier SA10. In the present embodiment as well, the same effects as those in the circuit of the third embodiment shown in FIG. 16 can be attained.

Seventh Embodiment

Figure 23:
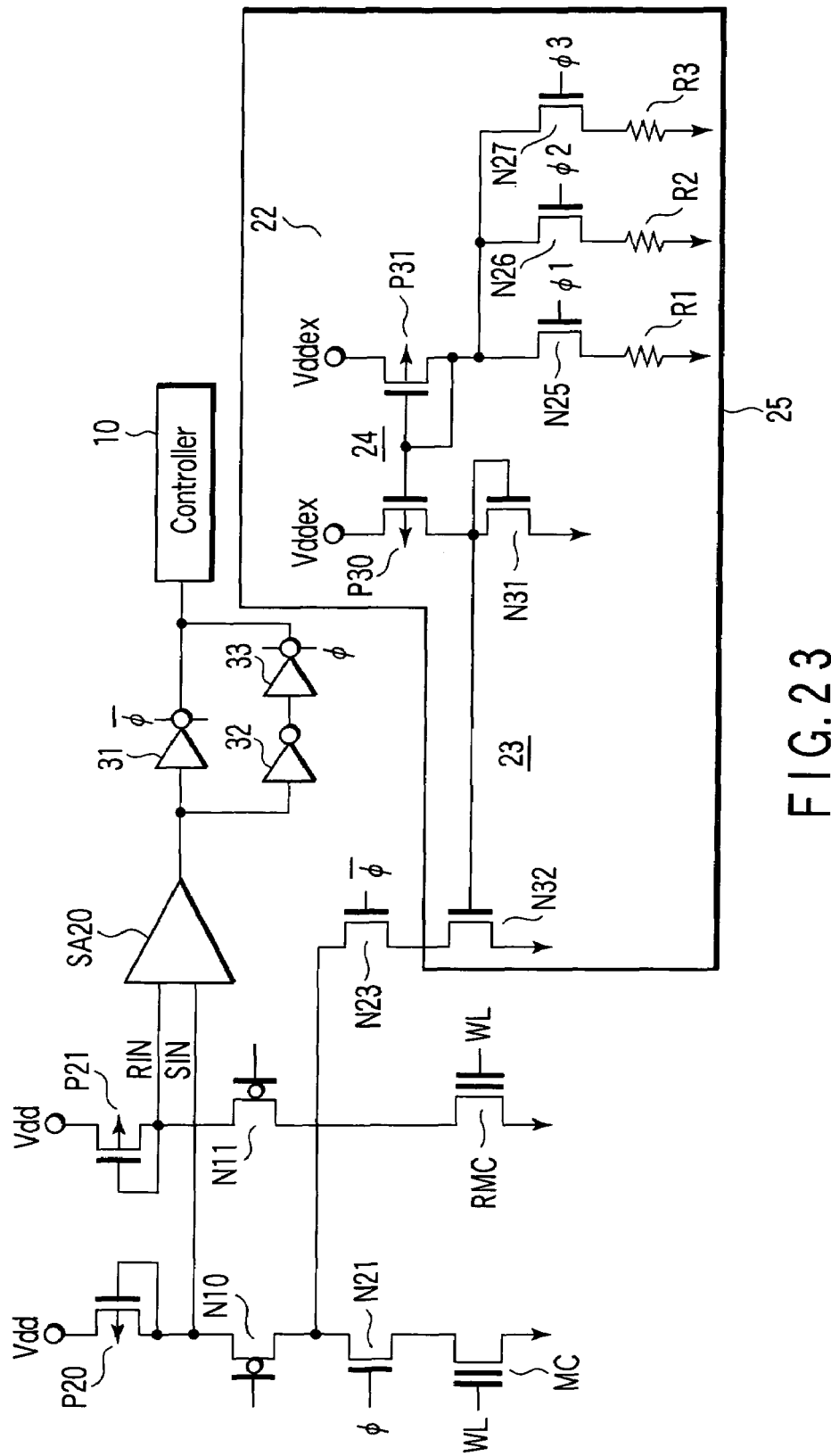
FIG. 23 is a circuit diagram of a flash memory according to a seventh embodiment.

FIG. 23 is a circuit diagram showing the configuration around a sense amplifier of a flash memory according to a seventh embodiment. Note that the circuit shown in FIG. 23 is different from the circuit according to the fourth embodiment shown in FIG. 18 in that as the load circuit of the memory cell MC and the reference memory cell RMC, two PMOS's P20 and P21 for load are used in the place of the current mirror type load circuit 20, and that a current mirror type sense amplifier SA20 is used in the place of the sense amplifier SA10. In the present embodiment as well, the same effects as those in the circuit of the fourth embodiment shown in FIG. 18 can be attained.

FIG. 24 is a circuit diagram showing the configuration around a sense amplifier of a flash memory according to a modified example of the seventh embodiment. Note that the circuit shown in FIG. 24 is different from the circuit according to the modified example of the fourth embodiment shown in FIG. 19 in that as the load circuit of the memory cell MC and the reference memory cell RMC, two PMOS's P20 and P21 for load are used in the place of the current mirror type load circuit 20, and that a current mirror type sense amplifier SA20 is used in the place of the sense amplifier SA10. Also in the present embodiment, the same effects as those in the circuit of the modified example of the fourth embodiment shown in FIG. 19 can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A non-volatile semiconductor memory device comprising:
    a main memory cell which is included a non-volatile transistor and whose threshold voltage is adjustable;
    a reference memory cell which is included a non-volatile transistor and whose threshold voltage is adjustable;
    a sense amplifier which has a first input node, a second input nodes and an output node, the reference memory cell being coupled to the first input node;
    a current mirror type load circuit connected to the first input node and the second input node of the sense amplifier;
    a first transistor which has one end and the other end, the one end being coupled to the second input node of the sense amplifier;
    a reference current source circuit connected to the other end of the first transistor;
    a second transistor which has one end and the other end, the one end being coupled to the second input node of the sense amplifier, and the main memory cell being connected to the other end; and
    a controller which generates a control signal to control the first transistor being turned on and the second transistor being turned off when the threshold voltage of the reference memory cell is adjusted, and to control the first transistor being turned off and the second transistor being turned on when the threshold voltage of the main memory cell is adjusted at verification of writing to/erasing from the main memory cell.

2. A non-volatile semiconductor memory device according to claim 1, wherein the current mirror type load circuit includes:
- a third transistor which has a current path and a gate, the current path being inserted between a supply node of a power source voltage and the first input node of the sense amplifier, and the gate being connected to the first input node; and
- a fourth transistor which has a current path and a gate, the current path being inserted between the supply node of the power source voltage and the second input node of the sense amplifier, and the gate being connected to the first input node.

3. A non-volatile semiconductor memory device according to claim 1, further comprising an inversion circuit connected to the output node of the sense amplifier, the inversion circuit inverting and outputting an output signal of the sense amplifier when the threshold voltage of the reference memory cell is adjusted.

4. A non-volatile semiconductor memory device according to claim 1, wherein the reference current source circuit includes:
- a plurality of resistors whose resistance values are different from one another; and
- selection circuits which are connected to said plurality of resistors, the selection circuits selecting one resistor from among said plurality of resistors, and supplying a current flowing in the selected one resistor to the other end of the first transistor.

5. A non-volatile semiconductor memory device according to claim 1, wherein the reference current source circuit includes:
- a reference current generation circuit which outputs reference currents of plural values different from one another; and
- a first current mirror circuit which is connected to the reference current generation circuit, and supplies a current of a value in proportion to the reference current output from the reference current generation circuit to the other end of the first transistor.

6. A non-volatile semiconductor memory device according to claim 5, wherein the reference current generation circuit includes:
- a plurality of resistors whose resistance values are different from one another; and
- selection circuits which are connected to the plural resistors, the selection circuits selecting one resistor from among said plurality of resistors, and supplying a current flowing in the selected one resistor to the current supply circuit.

7. A nonvolatile semiconductor memory device according to claim 6, wherein the reference current generation circuit further includes:
- a second current mirror circuit which is connected to the selection circuits and the current supply circuit, and is supplied with a power source voltage.

8. A nonvolatile semiconductor memory device according to claim 7, further comprising a first external terminal to which the power source voltage to be supplied to the second current mirror circuit is provided from outside.

9. A non-volatile semiconductor memory device according to claim 8, further comprising a second external terminal to monitor the current flowing in the first current mirror circuit.

10. A non-volatile semiconductor memory device according to claim 9, further comprising a control circuit which is connected to the second external terminal, and controls a value of the power source voltage to be supplied to the first external terminal in response to a value of the monitored current.

11. A non-volatile semiconductor memory device comprising:
- a main memory cell which is included a non-volatile transistor and whose threshold voltage is adjustable;
- a reference memory cell which is included a non-volatile transistor and whose threshold voltage is adjustable;
- a current mirror type sense amplifier which has a first input node, a second input nodes and an output node, the reference memory cell being coupled to the first input node;
- a first transistor which has one end and the other end, the one end being coupled to the second input node of the sense amplifier;
- a reference current source circuit connected to the other end of the first transistor;
- a second transistor which has one end and the other end, the one end being coupled to the second input node of the sense amplifier, and the main memory cell being connected to the other end; and
- a controller which generates a control signal to control the first transistor being turned on and the second transistor being turned off when the threshold voltage of the reference memory cell is adjusted, and to control the first transistor being turned off and the second transistor being turned on when the threshold voltage of the main memory cell is adjusted at verification of writing to/erasing from the main memory cell.

12. A non-volatile semiconductor memory device according to claim 11, wherein the current mirror type sense amplifier includes:
- a third transistor which has one end, the other end and a gate, the one end being connected to a supply node of a power source voltage, and the gate being connected to the first input node;
- a fourth transistor which has one end, the other end and a gate, the one end being connected to the supply node of the power source voltage, and the gate being connected to the second input node;
- a fifth transistor which has one end, the other end and a gate, the one end being connected to a supply node of a ground voltage, and the other end being connected to the other end of the third transistor; and
- a sixth transistor which has one end, the other end and a gate, the one end being connected to the supply node of the ground voltage and the other end being connected to the other end of the fourth transistor, and the gate being connected in common with the gate of the fifth transistor, the common gate being connected to the other end of the fourth transistor.

13. A non-volatile semiconductor memory device according to claim 11, further comprising an inversion circuit connected to the output node of the sense amplifier, the inversion circuit inverting and outputting an output signal of the sense amplifier when the threshold voltage of the reference memory cell is adjusted.

14. A non-volatile semiconductor memory device according to claim 11, wherein the reference current source circuit includes:
- a plurality of resistors whose resistance values are different from one another; and
- selection circuits which are connected to said plurality of resistors, the selection circuits selecting one resistor from among said plurality of resistors, and supplying a current flowing in the selected one resistor to the other end of the first transistor.

15. A non-volatile semiconductor memory device according to claim 11, wherein the reference current source circuit includes:
  a reference current generation circuit which outputs reference currents of plural values different from one another; and
  a first current mirror circuit which is connected to the reference current generation circuit, and supplies a current of a value in proportion to the reference current output from the reference current generation circuit to the other end of the first transistor.

16. A non-volatile semiconductor memory device according to claim 15, wherein the reference current generation circuit includes:
  a plurality of resistors whose resistance values are different from one another; and
  selection circuits which are connected to the plural resistors, the selection circuits selecting one resistor from among said plurality of resistors, and supplying a current flowing in the selected one resistor to the current supply circuit.

17. A non-volatile semiconductor memory device according to claim 16, wherein the reference current generation circuit further includes:
  a second current mirror circuit which is connected to the selection circuits and the current supply circuit, and is supplied with a power source voltage.

18. A non-volatile semiconductor memory device according to claim 17, further comprising a first external terminal to which the power source voltage to be supplied to the second current mirror circuit is provided from outside.

19. A non-volatile semiconductor memory device according to claim 18, further comprising a second external terminal to monitor the current flowing in the first current mirror circuit.

20. A non-volatile semiconductor memory device according to claim 19, further comprising a control circuit which is connected to the second external terminal, and controls a value of the power source voltage to be supplied to the first external terminals in response to a value of the monitored current.

* * * * *